US012666658B2

(12) United States Patent
Sampath et al.

(10) Patent No.: US 12,666,658 B2
(45) Date of Patent: Jun. 23, 2026

(54) BURIED SHIELD STRUCTURES FOR POWER SEMICONDUCTOR DEVICES AND RELATED FABRICATION METHODS

(71) Applicant: Wolfspeed, Inc., Durham, NC (US)

(72) Inventors: Madankumar Sampath, Morrisville, NC (US); Sei-Hyung Ryu, Cary, NC (US); Daniel Jenner Lichtenwalner, Raleigh, NC (US); Woongsun Kim, Cary, NC (US); Naeem Islam, Morrisville, NC (US)

(73) Assignee: Wolfspeed, Inc., Durham, NC (US)

( * ) Notice: Subject to any disclaimer, the term of this patent is extended or adjusted under 35 U.S.C. 154(b) by 516 days.

(21) Appl. No.: 18/150,432

(22) Filed: Jan. 5, 2023

(65) Prior Publication Data

US 2024/0234507 A1    Jul. 11, 2024

(51) Int. Cl.
| | |
|---|---|
| *H10D 30/69* | (2025.01) |
| *H10D 12/01* | (2025.01) |
| *H10D 30/66* | (2025.01) |
| *H10D 30/80* | (2025.01) |
| *H10D 62/10* | (2025.01) |
| *H10D 62/17* | (2025.01) |
| *H10D 62/80* | (2025.01) |
| *H10D 62/82* | (2025.01) |

(Continued)

(52) U.S. Cl.
CPC ......... *H10D 30/751* (2025.01); *H10D 12/031* (2025.01); *H10D 30/668* (2025.01); *H10D 30/801* (2025.01); *H10D 62/127* (2025.01); *H10D 62/314* (2025.01); *H10D 62/82* (2025.01); *H10D 62/8325* (2025.01); *H10D 62/80* (2025.01); *H10D 62/8503* (2025.01)

(58) Field of Classification Search
CPC .. H10D 30/751; H10D 12/031; H10D 30/668; H10D 30/801; H10D 62/127; H10D 62/314; H10D 62/82; H10D 62/8325; H10D 62/80; H10D 62/8503; H10D 30/603; H10D 64/117; H10D 64/256
See application file for complete search history.

(56) References Cited

U.S. PATENT DOCUMENTS

| | | | |
|---|---|---|---|
| 11,152,469 | B2 | 10/2021 | Narita |
| 11,355,630 | B2 | 6/2022 | Kim et al. |
| 12,376,319 | B2 | 7/2025 | Kim et al. |

(Continued)

FOREIGN PATENT DOCUMENTS

DE    102019212642 A1 *    8/2019

OTHER PUBLICATIONS

Notification of Transmittal of the International Search Report and the Written Opinion of the International Searching Authority, or the Declaration, in corresponding PCT Application No. PCT/US2023/084981 (mailed May 31, 2024).

*Primary Examiner* — Mohammad A Rahman
(74) *Attorney, Agent, or Firm* — Myers Bigel, P.A.

(57) ABSTRACT

A semiconductor device includes a semiconductor layer structure having a drift region of a first conductivity type and a well region of a second conductivity type above the drift region. A gate is provided on the semiconductor layer structure adjacent the well region. A buried shielding structure of the second conductivity type is provided under the well region and separated from the well region by a portion of the drift region. Related devices and fabrication methods are also discussed.

41 Claims, 22 Drawing Sheets

(51) Int. Cl.
    *H10D 62/832*     (2025.01)
    *H10D 62/85*     (2025.01)

(56)                References Cited

U.S. PATENT DOCUMENTS

| | | | |
|---|---|---|---|
| 2008/0173876 A1* | 7/2008 | Ueno | H10D 84/141 |
| | | | 257/77 |
| 2017/0110534 A1 | 4/2017 | Shiomi | |
| 2021/0343834 A1 | 11/2021 | Lichtenwalner | |
| 2022/0130996 A1 | 4/2022 | Islam et al. | |
| 2022/0149196 A1 | 5/2022 | Kim et al. | |

* cited by examiner

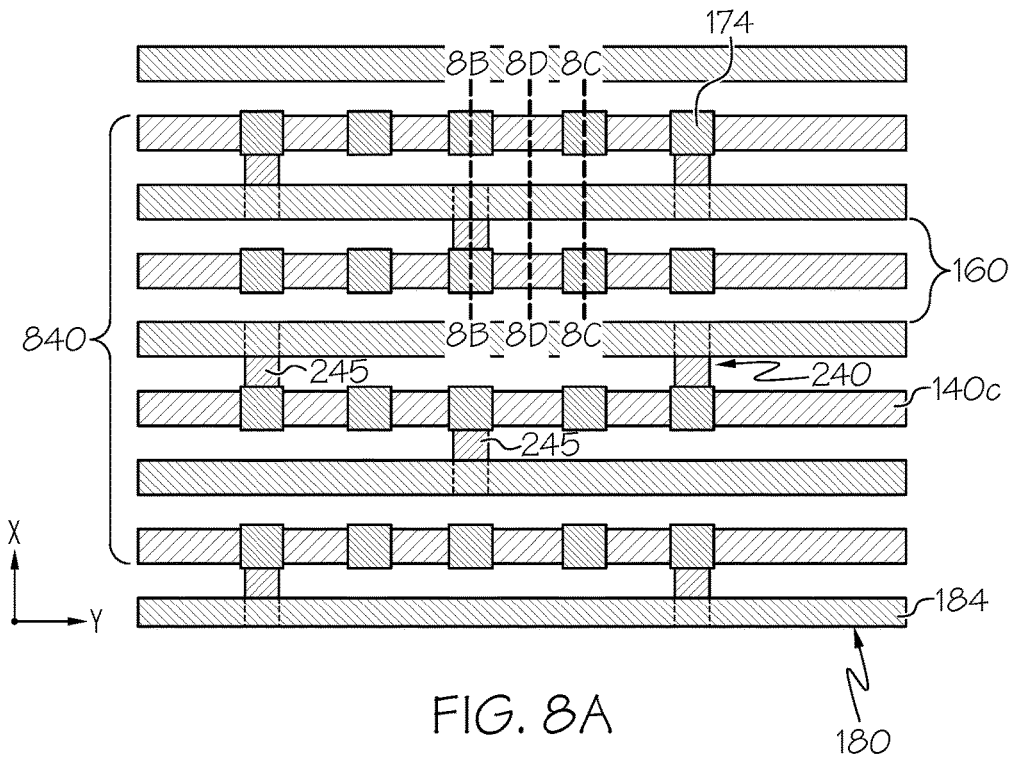
FIG. 8A
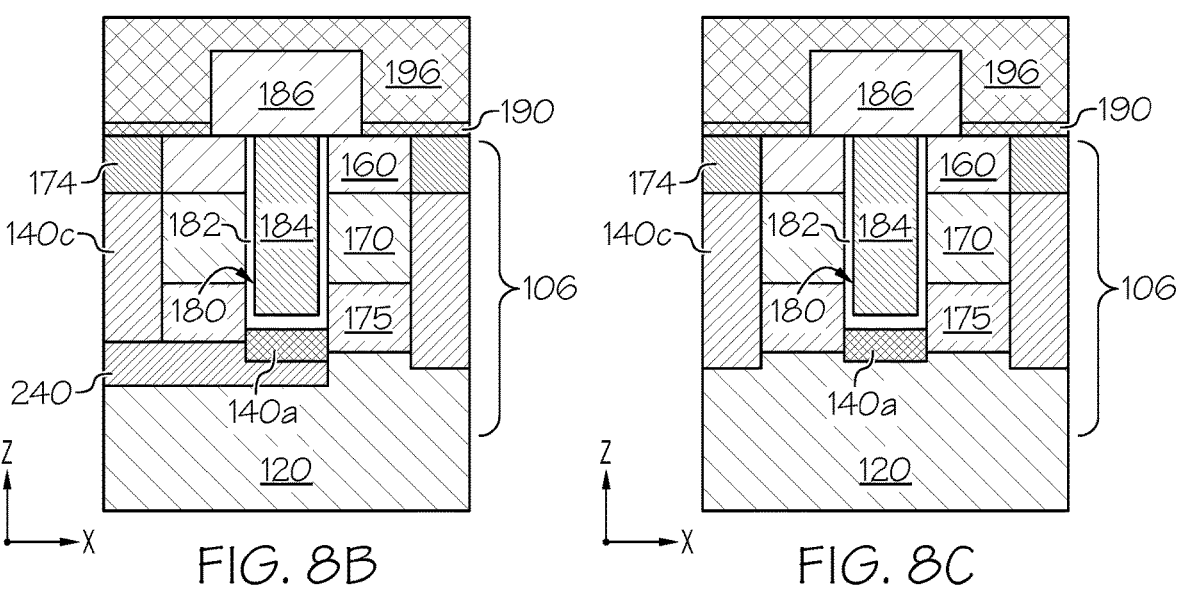
FIG. 8B                    FIG. 8C

BURIED SHIELD STRUCTURES FOR POWER SEMICONDUCTOR DEVICES AND RELATED FABRICATION METHODS

FIELD

The present invention relates to semiconductor devices and, more particularly, to power semiconductor devices.

BACKGROUND

Power semiconductor devices refer to devices that include one or more "power" semiconductor die that are designed to carry large currents (e.g., tens or hundreds of Amps) and/or that are capable of blocking high voltages (e.g., hundreds, thousand or tens of thousands of volts). A wide variety of power semiconductor devices are known in the art including, for example, power Metal Insulator Semiconductor Field Effect Transistors ("MISFETs", including Metal Oxide Semiconductor FETs ("MOSFETs")), bipolar junction transistors ("BJTs"), Insulated Gate Bipolar Transistors ("IGBT"), Junction Barrier Schottky diodes, Gate Turn-Off Transistors ("GTO"), MOS-controlled thyristors, and various other devices. These power semiconductor devices are generally fabricated from wide bandgap semiconductor materials, for example, silicon carbide ("SiC") or Group III nitride (e.g., gallium nitride ("GaN"))-based semiconductor materials. Herein, a wide bandgap semiconductor material refers to a semiconductor material having a bandgap greater than about 1.40 eV, for example, greater than about 2 eV.

A conventional power semiconductor device typically has a semiconductor substrate having a first conductivity type (e.g., an n-type substrate) on which an epitaxial layer structure having the first conductivity type (e.g., n-type) is formed. A portion of this epitaxial layer structure (which may comprise one or more separate layers) functions as a drift layer or drift region of the power semiconductor device. The device typically includes an "active region," which includes one or more "unit cell" structures that have a junction, for example, a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices.

Power semiconductor devices may have a unit cell configuration in which a large number of individual unit cell structures of the active region are electrically connected (e.g., in parallel) to function as a single power semiconductor device. In high power applications, such a power semiconductor device may include thousands or tens of thousands of unit cells implemented in a single chip or "die." A die or chip may include a small block of semiconducting material or other substrate in which electronic circuit elements are fabricated. For example, a plurality of individual power semiconductor devices may be formed on a relatively large semiconductor substrate (e.g., by growing epitaxial layers there on doping selected regions with dopants, forming insulation and metal layers thereon, etc.) and the completed structure may then be cut (e.g., by a sawing or dicing operation) into a plurality of individual die, each of which is a power semiconductor device.

Power semiconductor devices can have a lateral structure or a vertical structure. In a device having a lateral structure, the terminals of the device (e.g., the drain, gate and source terminals for a power MOSFET device) are on the same major surface (e.g., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more semiconductor layers, including semiconductor substrates and/or semiconductor epitaxial layers.

Vertical power semiconductor devices, such as MOSFET or IGBT devices, can have a standard gate electrode design in which the gate electrode of the transistor is formed on top of the semiconductor layer structure (referred to herein as planar gate devices) or, alternatively, may have the gate electrode buried in a trench within the semiconductor layer structure (referred to as gate trench devices). With the standard gate electrode design, the channel region of each unit cell transistor is horizontally disposed underneath the gate electrode. In contrast, in the gate trench design, the channel is vertically disposed. Gate trench devices may provide enhanced performance, but typically require more complex manufacturing processes.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. As the applied voltage approaches or passes the voltage level that the device is designed to block, non-trivial levels of current (referred to as leakage current) may begin to flow through the power semiconductor device. The blocking capability of the device may be a function of, among other things, the doping density/concentration and thickness of the drift region. Leakage currents may also arise for other reasons, such as failure of the edge termination and/or the primary junction of the device. If the voltage applied to the device is increased beyond the breakdown voltage to a critical level, the increasing electric field may result in an uncontrollable and undesirable runaway generation of charge carriers within the semiconductor device, leading to a condition known as avalanche breakdown.

SUMMARY

According to some embodiments, a semiconductor device includes a semiconductor layer structure comprising a drift region of a first conductivity type and a well region of a second conductivity type above the drift region; a gate on the semiconductor layer structure adjacent the well region; and a buried shielding structure of the second conductivity type under the well region and separated therefrom by a portion of the drift region.

In some embodiments, at least one contact shielding structure of the second conductivity type vertically extends into the drift region and is laterally spaced apart from the gate. The buried shielding structure laterally extends in the drift region from under the well region to the at least one contact shielding structure.

In some embodiments, the semiconductor layer structure further comprises a gate trench having sidewalls and a bottom surface therebetween extending into the drift region, where the gate is in the gate trench. A bottom shielding structure of the second conductivity type is provided under the bottom surface of the gate trench. The buried shielding structure laterally extends from the bottom shielding structure to the at least one contact shielding structure.

In some embodiments, at least one of the buried shielding structure and the contact shielding structure comprises a material that is different from that of the drift region.

In some embodiments, the drift region comprises a wide bandgap semiconductor material, and the at least one of the buried shielding structure and the contact shielding structure comprises polysilicon, nickel oxide, gallium nitride, or gallium oxide.

In some embodiments, the buried shielding structure has a different concentration of dopants of the second conductivity type than the well region.

In some embodiments, the semiconductor layer structure further comprises a substrate, where the drift region is on the substrate, and a drain contact on the substrate opposite the drift region, where the buried shielding structure laterally extends in the drift region between the well region and the drain contact.

In some embodiments, the semiconductor layer structure further comprises a current spreading region of the first conductivity type extending between the well region and the drain contact, where the current spreading region comprises a greater dopant concentration than the drift region.

In some embodiments, the buried shielding structure comprises a pattern including one or more segments that extend in a first lateral direction, and the gate extends in a second lateral direction that is different from the first lateral direction.

In some embodiments, a respective width of the one or more segments along the second lateral direction is between about 0.1 and 20 microns.

In some embodiments, the one or more segments of the buried shielding structure and/or the gate provide linear, elliptical, or polygonal shapes in plan view.

In some embodiments, the one or more segments are laterally spaced apart such that at least a part of an electrical conduction path between the well region and the drain contact laterally extends along the buried shielding structure in the second lateral direction.

In some embodiments, the gate comprises a first gate of a first transistor in the semiconductor layer structure, and the buried shielding structure comprises a second gate of a second transistor in the semiconductor layer structure.

In some embodiments, the first and second transistors are electrically coupled in a cascode amplifier configuration.

In some embodiments, the semiconductor layer structure further comprises a source region of the first conductivity type above the well region. A source contact is provided on a surface of the semiconductor layer structure opposite the drain contact, where the source contact is electrically coupled to the source region and the buried shielding structure.

According to some embodiments, a semiconductor device includes a semiconductor layer structure comprising: a drift region of a first conductivity type; a buried shielding structure of a second conductivity type in the drift region; a well region of the second conductivity type above the drift region; and a source region of the first conductivity type above the well region. The source region, the well region, and a first portion of the drift region between the well region and the buried shielding structure provide p-n junctions of a first transistor, and the first portion of the drift region, the buried shielding structure, and a second portion of the drift region provide p-n junctions of a second transistor.

In some embodiments, a gate is provided on the semiconductor layer structure adjacent the well region. The gate comprises a first gate of the first transistor, and the buried shielding structure comprises a second gate of the second transistor.

In some embodiments, the first and second transistors are electrically coupled in a cascode amplifier configuration.

In some embodiments, a source contact is provided on a surface of the semiconductor layer structure opposite the drain contact, where the source contact is electrically coupled to the source region and the buried shielding structure.

In some embodiments, a gate trench having sidewalls and a bottom surface therebetween extends into the drift region, with the gate in the gate trench. At least one contact shielding structure of the second conductivity type vertically extends into the drift region laterally spaced apart from the sidewalls of the gate trench to contact the buried shielding structure, or a metal layer extends from the source contact along at least one of the sidewalls of the gate trench to contact the buried shielding structure.

According to some embodiments, a semiconductor device includes a semiconductor layer structure comprising a first surface and a second surface opposite the first surface; a gate adjacent the first surface of the semiconductor structure; a drain contact on the second surface of the semiconductor structure; and first and second transistors in the semiconductor layer structure and electrically coupled in a cascode amplifier configuration between the first and second surfaces thereof.

In some embodiments, the semiconductor layer structure comprises a drift region of a first conductivity type; a buried shielding structure of a second conductivity type in the drift region; a well region of the second conductivity type above the drift region; and a source region of the first conductivity type above the well region. The source region, the well region, and a first portion of the drift region between the well region and the buried shielding structure provide the first transistor, and the first portion of the drift region, the buried shielding structure, and a second portion of the drift region provide the second transistor.

In some embodiments, a source contact is provided on the first surface of the semiconductor layer structure, where the source contact is electrically coupled to the source region and the buried shielding structure.

In some embodiments, the semiconductor layer structure further comprises a gate trench having sidewalls and a bottom surface therebetween extending into the drift region, wherein the gate is in the gate trench. At least one contact shielding structure of the second conductivity type vertically extends into the drift region laterally spaced apart from the sidewalls of the gate trench to contact the buried shielding structure, or a metal layer extends from the source contact along at least one of the sidewalls of the gate trench to contact the buried shielding structure.

According to some embodiments, method of fabricating a semiconductor device includes providing a drift region of a first conductivity type; providing a buried shielding structure of a second conductivity type in the drift region; providing a well region of the second conductivity type above the drift region and separated from the buried shielding structure, where the drift region, the buried shielding structure, and the well region form a semiconductor layer structure; and providing a gate on the semiconductor layer structure adjacent the well region.

In some embodiments, the buried shielding structure comprises a pattern including one or more segments that laterally extend in the drift region.

In some embodiments, providing the buried shielding structure comprises forming a first portion of the drift region by a first epitaxy process; forming the buried shielding structure in or on the first portion of the drift region; and forming a second portion of the drift region on the buried shielding structure by a second epitaxy process.

In some embodiments, forming the buried shielding structure comprises implanting dopants of the second conductivity type into or depositing a material of the second conductivity type on the first portion of the drift region to form the buried shielding structure.

In some embodiments, the method further includes forming a mask pattern on the first portion of the drift region before the implanting or the depositing. The implanting or the depositing is performed in or on areas of the drift region exposed by the mask pattern to form the pattern of the buried shielding structure.

In some embodiments, the implanting or the depositing is performed as a blanket process without a mask pattern. The method further includes forming a mask pattern on the first portion of the drift region after the implanting or the depositing, and performing an etching process on areas of the first portion of the drift region exposed by the mask pattern to form the pattern of the buried shielding structure.

In some embodiments, the method further includes forming a current spreading region comprising a greater concentration of dopants of the first conductivity type in the first portion of the drift region. The buried shielding structure extends adjacent the current spreading region.

In some embodiments, providing the buried shielding structure comprises forming a mask pattern on a surface of the drift region, and implanting dopants of the second conductivity type into areas of the drift region exposed by the mask pattern with an implantation energy corresponding to a predetermined depth below the surface of the drift region to form the pattern of the buried shielding structure.

In some embodiments, the semiconductor layer structure comprises a substrate, where the drift region is on the substrate. The method further includes providing a drain contact on the substrate opposite the drift region, where the buried shielding structure laterally extends in the drift region between the well region and the drain contact.

In some embodiments, the gate comprises a first gate of a first transistor in the semiconductor layer structure, and the buried shielding structure comprises a second gate of a second transistor in the semiconductor layer structure.

In some embodiments, the first and second transistors are electrically coupled in a cascode amplifier configuration.

In some embodiments, the method further includes providing a source region of the first conductivity type above the well region, and providing a source contact on a surface of the semiconductor layer structure opposite the drain contact, where the source contact is electrically coupled to the source region and the buried shielding structure.

In some embodiments, providing the gate comprises forming a gate trench having sidewalls and a bottom surface therebetween extending into a surface of the semiconductor through the source region and the well region to a depth of about 0.3 to about 10 microns relative to the surface, and forming the gate in the gate trench.

In some embodiments, the method further comprises forming at least one contact shielding structure of the second conductivity type vertically extending into the drift region laterally spaced apart from the sidewalls of the gate trench to contact the buried shielding structure, or forming a metal layer extending from the source contact along at least one of the sidewalls of the gate trench to contact the buried shielding structure.

In some embodiments, the one or more segments extend in a first lateral direction, the gate extends in a second lateral direction that is different from the first lateral direction, and a respective width of the one or more segments along the second lateral direction is between about 0.1 and 20 microns.

In some embodiments, the one or more segments of the buried shielding structure and/or the gate provide linear, elliptical, or polygonal shapes in plan view.

In some embodiments, the buried shielding structure has a different concentration of dopants of the second conductivity type than the well region.

In some embodiments, the buried shielding structure comprises a material that is different from that of the drift region.

According to some embodiments, a method of fabricating a semiconductor device includes forming a first portion of a drift region; forming a buried shielding structure of a second conductivity type in or on the first portion of the drift region; forming a second portion of the drift region on the buried shielding structure; forming a well region of the second conductivity type above the drift region and separated from the buried shielding structure, where the drift region, the buried shielding structure, and the well region form a semiconductor layer structure; and forming a gate on the semiconductor layer structure adjacent the well region.

In some embodiments, the buried shielding structure comprises a pattern including one or more segments that laterally extend in the drift region. Forming the buried shielding structure includes implanting dopants of the second conductivity type into or depositing a material of the second conductivity type on the first portion of the drift region to form the buried shielding structure.

In some embodiments, the method further includes forming a mask pattern on the first portion of the drift region before the implanting or the depositing, where the implanting or the depositing is performed in or on areas of the first portion of the drift region exposed by the mask pattern to form the pattern of the buried shielding structure therein or thereon.

In some embodiments, the implanting or the depositing is performed as a blanket process without a mask pattern, and the method further includes forming a mask pattern on the first portion of the drift region after the implanting or the depositing, and performing an etching process on areas of the first portion of the drift region exposed by the mask pattern to form the pattern of the buried shielding structure.

According to some embodiments, a method of fabricating a semiconductor device includes forming a drift region of a first conductivity type; forming a buried shielding structure of a second conductivity type in the drift region below a surface thereof; forming a well region of the second conductivity type above the drift region and separated from the buried shielding structure, where the drift region, the buried shielding structure, and the well region form a semiconductor layer structure; and forming a gate on the semiconductor layer structure adjacent the well region.

In some embodiments, the buried shielding structure comprises a pattern including one or more segments that laterally extend in the drift region, and forming the buried shielding structure comprises forming a mask pattern on the surface of the drift region; and implanting dopants of the second conductivity type into areas of the drift region exposed by the mask pattern with an implantation energy corresponding to a predetermined depth below the surface of the drift region to form the pattern of the buried shielding structure.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 8A is a plan view illustrating patterns of buried shielding structures and gate electrodes according to some embodiments of the present disclosure. FIGS. 8B, 8C, and 8D are cross sectional views taken along lines 8B-8B, 8C-8C, and 8D-8D of the gate trench structures of FIG. 8A.

DETAILED DESCRIPTION OF EMBODIMENTS

Some embodiments of the present invention are directed to improvements in power semiconductor devices (e.g., MOSFETs, IGBTs, and other gate controlled power devices). In devices having gate electrodes and gate insulating layers formed within trenches in the semiconductor layer structure, high electric fields may degrade the gate insulating layer over time, and may eventually result in failure of the device. Deep shielding structures (also referred to herein as bottom shielding structures) may be provided underneath the gate trenches in order to reduce the electric field levels in the gate insulating layer, particularly at corners of the gate trenches where the electric field levels may be more concentrated. The bottom shielding structures may have the same conductivity type as the well regions, which is opposite the conductivity type of the drift region.

The bottom shielding structures may typically include highly doped semiconductor regions having the same conductivity type as the channel region. Methods for doping a semiconductor material with n-type and/or p-type dopants include (1) doping the semiconductor material during the growth thereof, (2) diffusing the dopants into the semiconductor material and (3) using ion implantation to selectively implant the dopants in the semiconductor material. When silicon carbide is doped during epitaxial growth, the dopants tend to unevenly accumulate, and hence the dopant concentration may vary by, for example, +/−15%, which can negatively affect device operation and/or reliability. Additionally, doping by diffusion may not be an option in silicon carbide, gallium nitride and various wide band-gap semiconductor devices since n-type and p-type dopants tend to not diffuse well (or at all) in those materials, even at high temperatures.

In light of the above, ion implantation is often used to dope wide band-gap semiconductor materials, such as silicon carbide. The depth at which the ions are implanted is directly related to the energy of the implant, i.e., ions implanted into a semiconductor layer at higher energies tend to go deeper into the layer. However, when dopant ions are implanted into a semiconductor layer, the ions damage the crystal lattice of the semiconductor layer. This lattice damage can typically only be partly repaired by thermal annealing processes. The amount of lattice damage may also be directly related to the implant energy, with higher energy implants tending to cause more lattice damage than lower energy implants. The uniformity of the dopant concentration also tends to decrease with increasing implant depth.

Figure 1A:
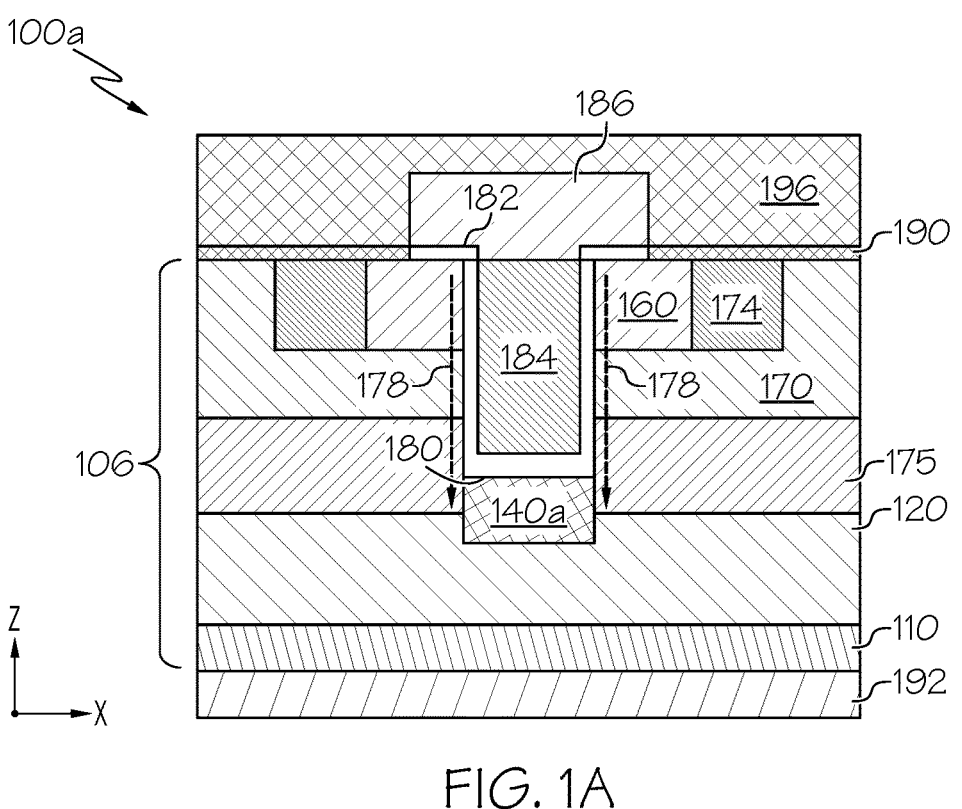
FIG. 1A is a schematic cross-sectional view illustrating an example unit cell of a gate trench power semiconductor device including bottom shielding regions positioned below the gate trenches.
Figure 1B:
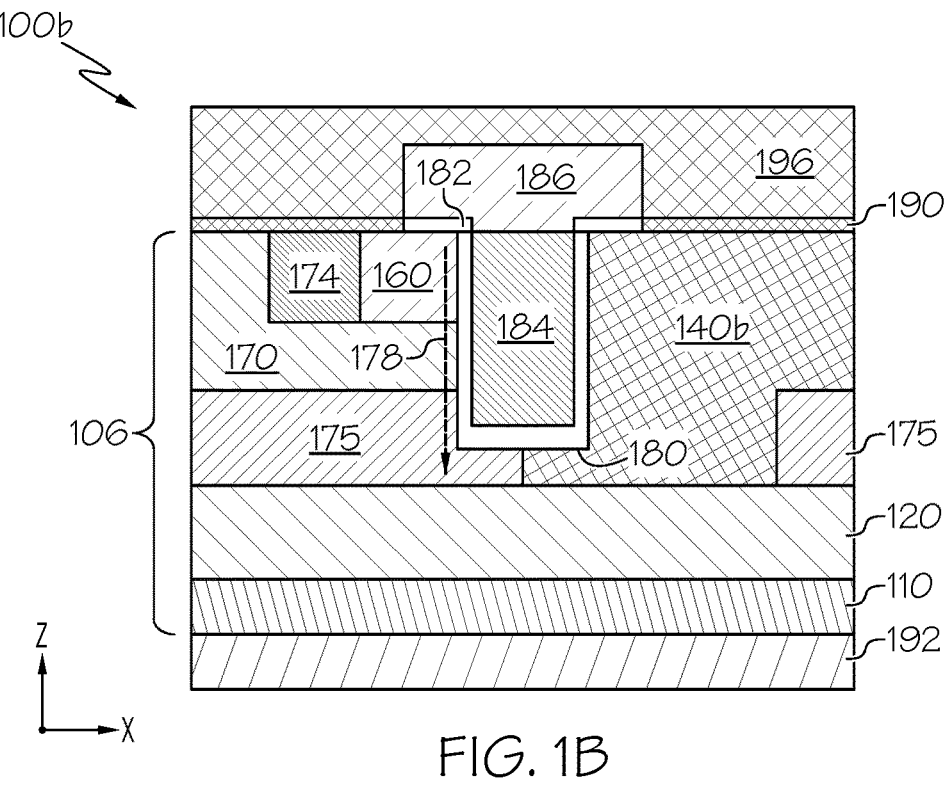
FIG. 1B is a schematic cross-sectional view illustrating an example unit cell of a gate trench power semiconductor device including shielding regions that are positioned below and along one sidewall of the gate trenches.

Various approaches may be used to form trenched vertical power semiconductor devices. FIGS. 1A and 1B schematically illustrate two examples of such different approaches.

FIGS. 1A and 1B are schematic cross-sectional views illustrating example unit cells of trenched vertical power devices (illustrated as power MOSFET 100a and 100b, respectively) including bottom P-type shielding regions 140a, 140b. As shown in FIGS. 1A and 1B, the power MOSFET 100a, 100b each include a heavily-doped (e.g., N+) first conductivity type (e.g., n-type) substrate 110. A lightly-doped (e.g., N−) first conductivity type drift layer or region 120 is provided on the substrate 110, for example by epitaxial growth. The drift region 120 may be wide bandgap semiconductor material (such as silicon carbide (SiC)) in some embodiments. For example, the substrate 110 may be a 4H-SiC substrate, and the drift region 120 may be a 4H-SiC n-type epitaxial layer formed on the substrate 110. A portion of the drift region 120 may include a current spreading layer ("CSL") 185 of the first conductivity type having a higher dopant concentration than the lower portions of the drift region 120. A moderately-doped second conductivity type (e.g., p-type) layer is formed on or in (for example, by epitaxial growth or implantation) the drift region 120 and acts as the well regions (e.g., "P-wells") 170 for the device 100a, 100b. Heavily-doped second conductivity type (e.g., P−) regions 174 are formed in the well regions 170, for example, via ion implantation. The transistor channels or conduction paths 178 may be formed in the moderately-doped regions P-wells 170. The substrate 110, drift region 120 (including current spreading layer 185), and the moderately doped layer defining the P-wells 170, along with the various regions/patterns formed therein, are included in a semiconductor layer structure (denoted by 106 herein).

Still referring to FIGS. 1A and 1B, trenches 180 are formed in the semiconductor layer structure 106, e.g., with 'striped' gate trench layouts in which the trenches 180 continuously extend in parallel to one another in a longitudinal direction. The trenches 180 are spaced apart in a lateral direction crossing (e.g., perpendicular to) the longitudinal direction, and extend into the drift region 120 toward the substrate 110 in a vertical direction. The trenches 180 (in which the gates electrodes 184a are formed) may be formed to extend through the moderately-doped layer 170 to define the respective P-wells. Heavily-doped (e.g., P+) second conductivity type shielding structures 140a, 140b are formed in the drift region 120, for example, by ion implantation. The shielding structures 140a, 140b may be in electrical connection with the P-wells 170. A gate insulating layer 182a (e.g., a gate oxide) is conformally formed on the bottom surface and sidewalls of each trench 180. The corners of the gate trench 180 and the gate insulating layer 182 thereon may be rounded even if illustrated otherwise.

A gate electrode 184a (or "gate") is formed on each gate insulating layer 182a to fill the respective gate trenches 180. Portions of the drift region 120 that are under the well regions 170 and/or adjacent a bottom of the gate electrode 184a may be referred to as "JFET" regions 175. Vertical transistor channel regions (with conduction 178 shown by dotted arrows) are defined in the well regions 170 adjacent the gate insulating layer 182a and controlled by the gate 184a. Heavily-doped source regions 160 of the first conductivity type (e.g. N+) are formed in upper portions of the P-wells 170, for example, via ion implantation. The heavily-doped regions 174 of the second conductivity type (e.g., a P+) contact the well regions 170. Source contacts 190 are formed on the source regions 160, on the heavily-doped regions 174, and (in FIG. 1B) on the deep shielding structures 140b. The source contacts 190 may be ohmic metal in some embodiments. A drain contact 192 is formed on the lower surface of the substrate 110. A gate contact (not shown) may be electrically connected to each gate electrode 184, for example, by a conductive gate bus (not shown). An intermetal dielectric layer 186 may be formed on the gates 184, and a metal (e.g., aluminum) layer 196 may be formed on the intermetal dielectric layer 186 to contact the source contacts 190. The source contacts 190 may extend on to the intermetal dielectric 186 layer in some embodiments, and may comprise, for example, diffusion barrier and/or adhesion layers.

As noted above, some devices may be susceptible to gate insulating layer degradation due to high electric fields, particularly in gate trench devices where electric fields may be concentrated at the trench corners. While bottom shielding structures may be provided underneath the gate trenches in order to reduce the electric field levels in the gate insulating layer, the bottom shielding structures should be electrically connected to the ohmic contact regions (on which the source metal may be formed) on the top surface of the device.

Embodiments of the present disclosure may provide buried shielding structures that laterally extend under and spaced apart from the well regions and/or gates, to provide electrical contact between contact shielding structures (which may vertically extend into the semiconductor layer structure) and the bottom shield structure. The buried shielding structures may be implemented without substantial loss of active area, as current can flow laterally in portions of the drift region between the well region and the buried shielding structure, and then vertically to the drain contact. The lateral extension of the buried shielding structure under multiple unit cells may allow for fewer or segmented source contacts in comparison to some conventional approaches, which may require a source contact in every unit cell. To increase or maximize conduction, the buried shielding structures may be implemented by relatively fine patterns, and/or a current spreading region with a higher concentration of dopants of the first conductivity type may be formed above and/or below the buried shielding structure. Buried shielding structures as described herein may also be used to implement a cascode configuration (e.g. including a JFET and MOSFET) between top and bottom surfaces of a semiconductor layer structure.

Figures 2A, 2B:
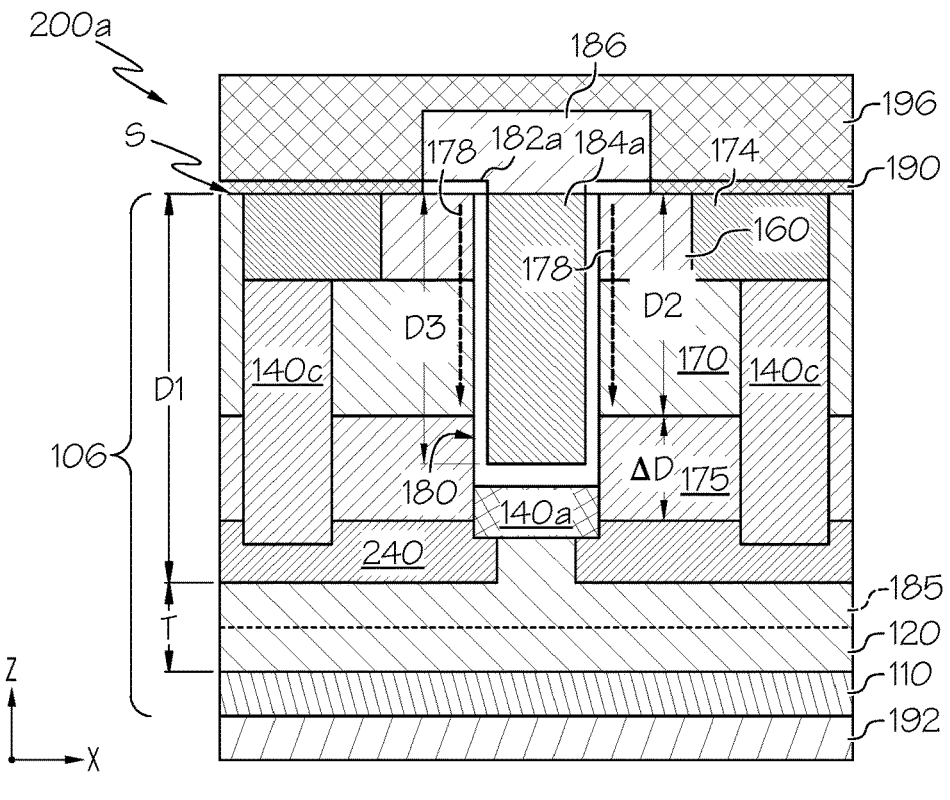
FIG. 2A is a schematic cross-sectional view illustrating an example unit cell of a gate trench power semiconductor device including buried shielding structures according to some embodiments of the present disclosure.
FIG. 2B is a schematic cross-sectional view illustrating an example unit cell of a planar gate power semiconductor device including buried shielding structures according to some embodiments of the present disclosure.

FIG. 2A is a schematic cross-sectional view illustrating an example unit cell of a gate trench power semiconductor device 200a including buried shielding structures 240 according to some embodiments of the present disclosure. FIG. 2B is a schematic cross-sectional view illustrating an example unit cell of a planar gate power semiconductor device 200b including buried shielding structures 240 according to some embodiments of the present disclosure.

As shown in the gate trench device 200a of FIG. 2A and the planar gate device 200b of FIG. 2B, the semiconductor layer structure 106 includes a drift region 120 of a first conductivity type (e.g., n-type) and a well region 170 of a second conductivity type (e.g., p-type) above the drift region 120. In the gate trench device 200a, the semiconductor layer structure 106 includes a gate trench 180 having sidewalls and a bottom surface therebetween extending into the drift region 120, with the gate 184a formed in the gate trench. In the planar gate device 200b, the gate 184b is formed on a surface S of the semiconductor layer structure 106. The gate 184a, 184b (collectively, 184) extends adjacent the well region 170 and is separated therefrom by a gate insulating layer 182a, 182b (collectively, 182), for example, a gate oxide layer. The source region, the well region 170, and the portion 175 of the drift region 120 under the well region 170 may provide p-n junctions of a first transistor TX1 in the semiconductor layer structure 106, with the well region 170 providing part of the transistor channel region that is controlled by the gate 184.

A buried shielding structure 240 of the second conductivity type extends under the well region 170 and is separated from the well region 170 by a portion 175 of the drift region 120 (e.g., the JFET region 175). The buried shielding structure 240 may have a different type or concentration of dopants of the second conductivity type than the well region 170, and may laterally extend in the drift region 120 (e.g., at a depth D1) between the well region 170 and the drain contact 192. The depth D1 of the buried shielding structure 240 in the drift region 120 may be greater than or equal to a depth D2 of the well region 170. The buried shielding structure 240 and the well region 170 are separated by a separation distance ΔD along the vertical (e.g., Z-) direction. The separation of the buried shielding structure 240 from the well region 170 (and likewise, from the bottom of the gate 184) may allow for improved current flow from the channel region to the drain at the device bottom. For example, the separation distance ΔD may be between about 0 to 4 micrometers (μm), or about 0.2 to 1.5 μm.

That is, the buried shielding structure 240 may be distinct from the well region 170 in material, dopant concentration, and/or depth relative to a surface S of the semiconductor layer structure 106. As described in greater detail below, the buried shielding structure 240 may be formed as a pattern including one or more segments 245 that extend in a first lateral direction (e.g., the X-direction), which may be different from a second lateral direction (e.g., the Y-direction) in which the gate 184 extends. The buried shielding structure 240 and the portions of the drift region 120 thereover and thereunder may provide p-n junctions of a second transistor TX2 in the semiconductor layer structure 106.

The cross sections of FIGS. 2A and 2B further illustrate at least one contact shielding structure 140c of the second conductivity type that vertically extends into the drift region 120 laterally spaced apart from the gate 184. In some embodiments, the contact shielding structure(s) 140c may be heavily doped (P⁺) silicon carbide regions formed by an ion implantation process. The buried shielding structure 240 laterally extends in the drift region 120 from under the well region 170 to at least one contact shielding structure 140c. The contact shielding structure 140c may electrically couple the source contact 190 to the buried shielding structure 240, e.g., for connection to electrical ground within a unit cell. The contact shielding structures 140c may have various shapes, including island-shapes (see, for example, FIG. 3A) or stripe-shapes (see, for example, FIG. 10A) in plan view. The contact shielding structure(s) 140c may also act as support shield structures that may reduce electric field levels in the gate oxide layers during device operation, and/or provide a low-resistance current path between the source and drain terminals of the MOSFET if avalanche breakdown occurs.

Portion(s) of the drift region 120 above and/or below the buried shielding structure 240 (more generally, between the well region 170 and the drain contact 192) may include an optional current spreading layer (CSL) or region 185 of the first conductivity type. The current spreading region 185 has a greater dopant concentration of the first conductivity type than the drift region 120. For example, for an n-type drift region 120, the current spreading region 185 may be an N+ region that is separated from the drain contact 192 by a lower portion of the drift region 120.

In the gate trench device 200a, the gate trench 180 may extend to a depth D3 that is greater than the depth D2 of the well region 170, but less than the depth D1 of the buried shielding structure 240. For example, the gate trench 180 may have a depth D3 of between about 0.3 to about 10 microns relative to the surface S of the semiconductor layer structure 106. In some embodiments, a bottom shielding structure 140a of the second conductivity type is provided under the bottom surface of the gate trench. As noted above, the bottom shielding structure 140a may reduce the electric field levels in the gate insulating layer 182a, particularly at corners of the gate trench 180 where the electric field levels may be more concentrated. The buried shielding structure 240 laterally extends from the bottom shielding structure 140a to the at least one contact shielding structure 140c, thereby electrically coupling the bottom shielding structure 140a to the source region 160 and the source contact 190 (which may be an ohmic contact region of the surface S).

The buried shielding structure 240 and/or the contact shielding structure 140c may be formed of a material that is different from that of the drift region 120. For example, the drift region 120 may include a wide bandgap semiconductor material (such as silicon carbide and/or gallium nitride), while the buried shielding structure 240 and/or the contact shielding structure 140c may include polysilicon, nickel oxide, gallium nitride, or gallium oxide. The buried shielding structure 240 and/or the contact shielding structure 140c may be formed of a same or different material and/or with a similar or different dopant concentration than the bottom shielding structures 140a (when present). In some embodiments, the shielding structures 140c and/or 240 may be defined by one or more implantation processes, with substantially uniform concentration or stepwise or continuous grading. The contact shielding structures 140c may include a higher concentration of dopants of the second conductivity type (e.g., about $1 \times 10^{17}$ to about $1 \times 10^{20}$ cm$^{-3}$) as compared to the buried shielding structures 240 (e.g., e.g., about $1 \times 10^{17}$ to about $5 \times 10^{19}$ cm$^{-3}$, or about $1 \times 10^{18}$ to about $1 \times 10^{19}$ cm$^{-3}$). The dopant concentration of the shielding structures 140c and/or 240 may be higher than that of the well regions 170 (e.g., more than about 10 times higher; for example, about 100 times higher). The dopant concentrations of the shielding structures 140c and/or 240 may vary based on implementation of the fabrication process and/or device design.

The buried shielding structure 240 may be implemented in various shapes or patterns, in some embodiments with fewer than one contact shielding structure 140c (or source contact) per unit cell, in contrast to some conventional devices which may require contact shielding structures and/or source contacts in every unit cell. As such, in embodiments of the present disclosure, a greater portion of the semiconductor layer structure 106 may function as the device active area for electrical conduction, and more sparse or segmented source contacts 190 may be provided on the surface S of the semiconductor layer structure 106 to provide electrical connection to the source regions 160 and the contact shielding structures 140c (and thus, to the buried shielding structure 240). The number and/or distance between the source contacts 190 may be optimized based on electrical performance and/or reliability. For example, providing more source contacts 190 and/or contact shielding structures 140c may increase device on-resistance (e.g., due to reduction of available active area), while fewer source contacts 190 and/or contact shielding structures 140c may be problematic as device resistance would increase, resulting in greater losses in switching operation.

FIGS. 3A, 3E, 4A, 4D, and 5A, are plan views illustrating semiconductor devices 300, 300', 400, 400', and 500 including example patterns 340, 340', 440, 440', and 540 of buried shielding structures 240 and gate electrodes 184 (including gate trench or planar gate structures) according to some embodiments of the present disclosure As shown in FIGS. 3A, 3E, 4A, 4D, and 5A, the buried shielding structure 240 may define various patterns that laterally extend in the drift region 120 in plan view. The patterns may include segments 245 that extend in at least one lateral direction (e.g., in the X- and/or Y-directions shown in the figures), but it will be understood that embodiments of the present disclosure are not limited to the particular patterns 340, 340', 440, 440', and 540 shown.

Figure 3A:
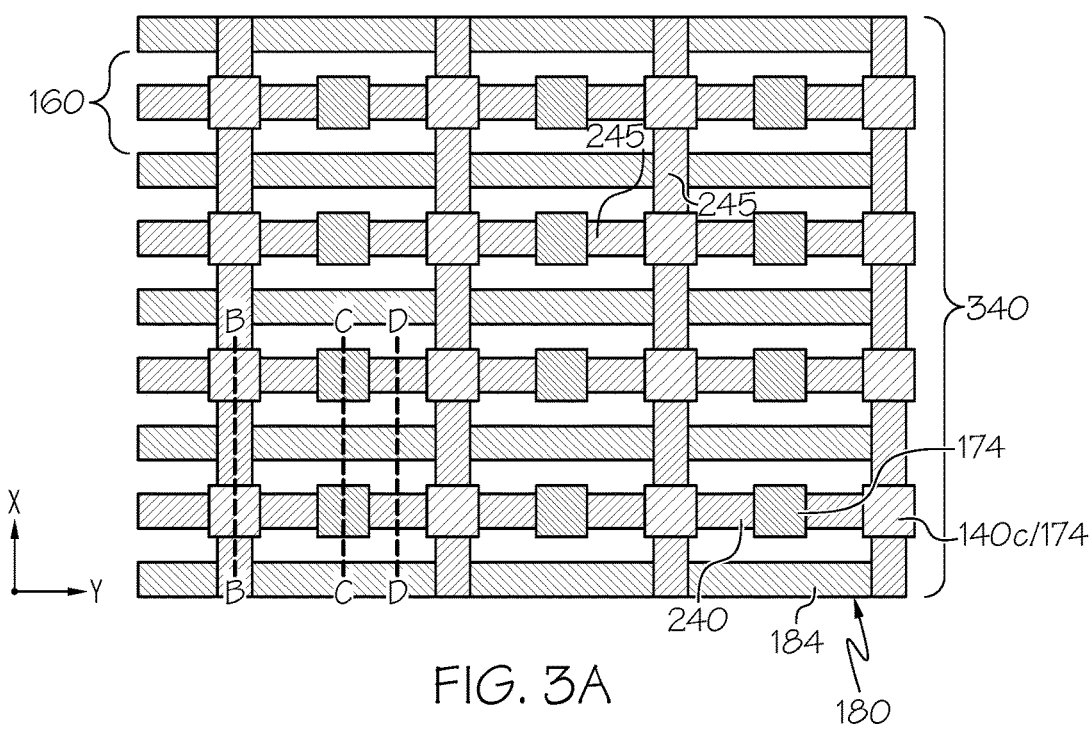
FIGS. 3A and 3E are plan views illustrating patterns of buried shielding structures and gate electrodes (including gate trench or planar gate structures) according to some embodiments of the present disclosure.

In the example pattern 340 of FIG. 3A, the segments 245 of the buried shielding structure 240 extend linearly in one of (and are laterally spaced apart in the other of) a first lateral direction (e.g., the X-direction) or a second lateral direction (e.g., the Y-direction), while the gates 184 (or gate trenches 180) extend in the second lateral direction. In the example pattern 340' of FIG. 3E, the segments 245 of the buried shielding structure 240 extend in the first lateral direction or in the second lateral direction, while the gates 184 (or gate trenches 180) extend in a third lateral direction (illustrated as diagonal to the first and second lateral directions). That is, FIGS. 3A and 3E illustrate example patterns 340, 340' in which segments 245 of the buried shielding structure 240 may linearly extend in one or more lateral directions in plan view.

Figure 4A:
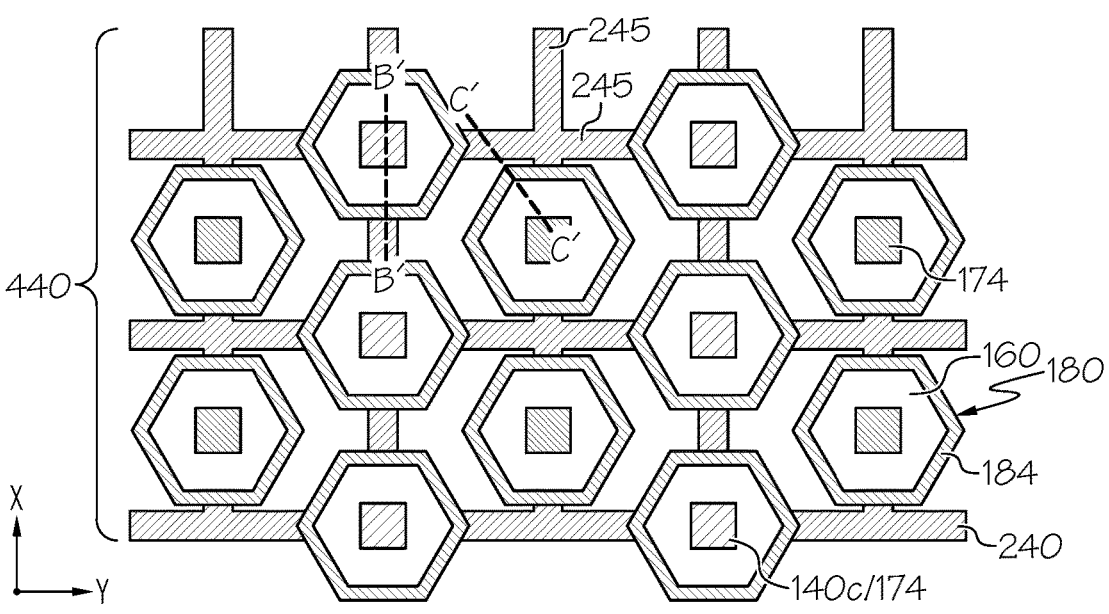
FIGS. 4A and 4D are plan views illustrating patterns of buried shielding structures and gate electrodes (including gate trench or planar gate structures) according to some embodiments of the present disclosure.
Figures 4B, 4C:
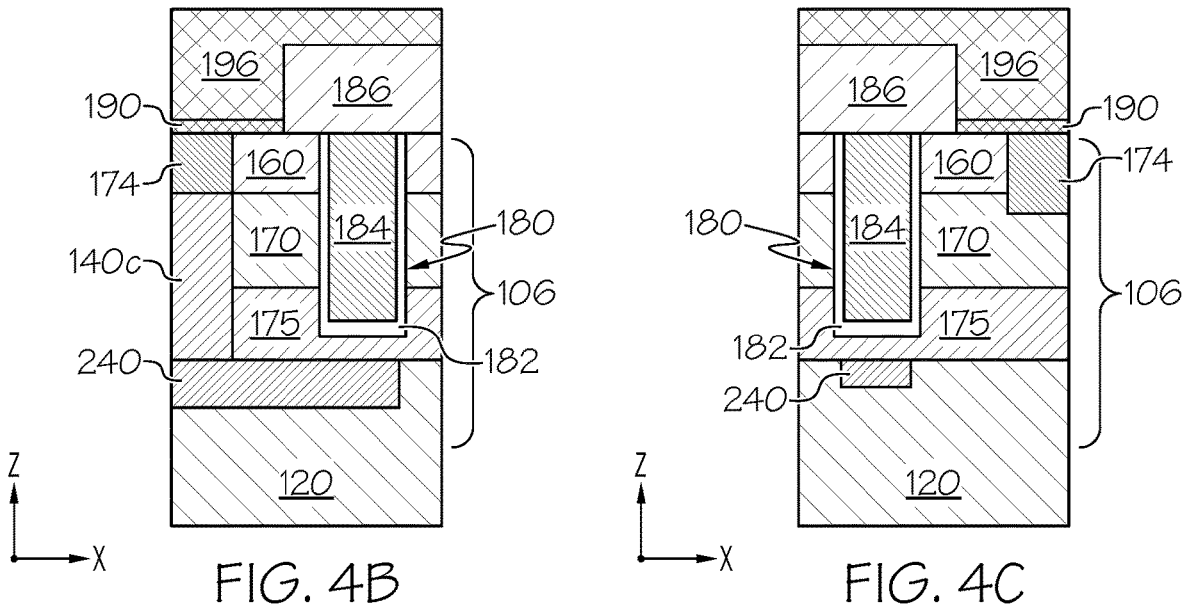
FIGS. 4B and 4C are cross sectional views taken along lines B'-B' and C'-C' of the gate trench structures of FIG. 4A or 4D.
Figure 4D:
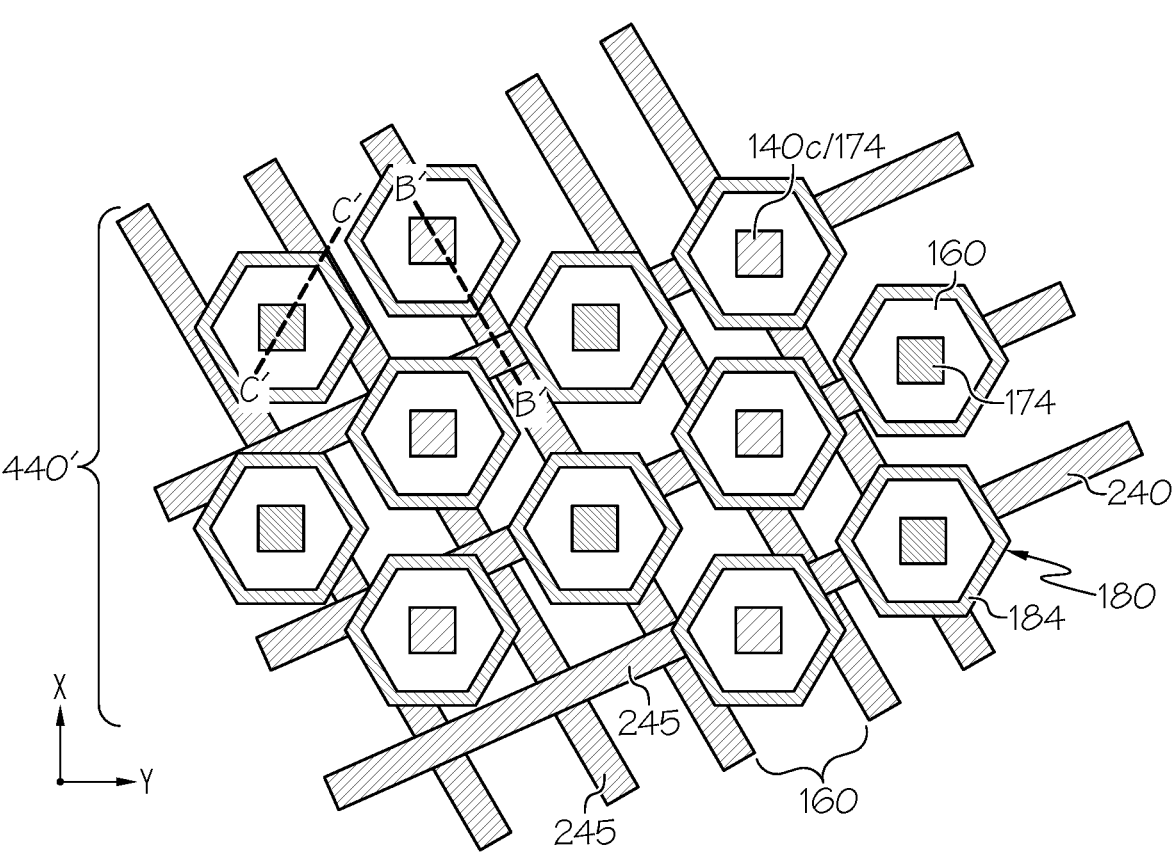

FIGS. 4A and 4D illustrate further examples of patterns 440, 440' of the buried shielding structure 240 according to embodiments of the present disclosure. In the example pattern 440 of FIG. 4A, the segments 245 of the buried shielding structure 240 linearly extend in both a first lateral direction (e.g., the X-direction) and in a second lateral direction (e.g., the Y-direction), while the gates 184 (or gate trenches 180) extend in multiple lateral directions to define respective polygonal shapes in plan view. A respective well region 170 and/or contact shielding region may be provided within a perimeter of the respective polygonal shapes defined by the gates 184 or gate trenches 180. In the example pattern 440' of FIG. 4D, the gates 184 (or gate trenches 180)

again define polygonal shapes, but with the segments 245 of the buried shielding structure 240 linearly extending in first and second lateral directions that are diagonal to the X- and Y-directions in plan view.

Figures 5A, 5B, 5C:
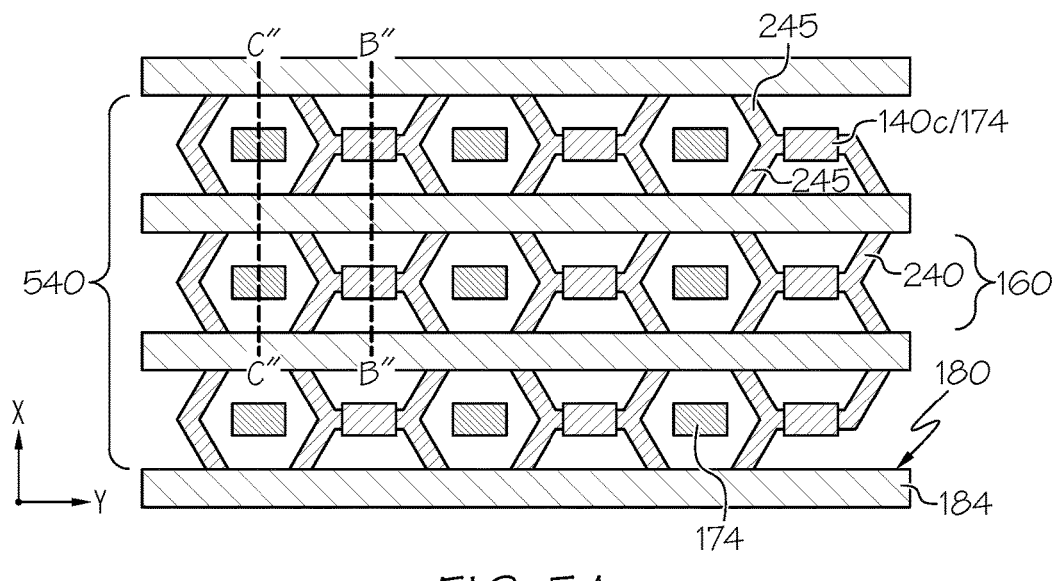
FIG. 5A is a plan view illustrating patterns of buried shielding structures and gate electrodes (including gate trench or planar gate structures) according to some embodiments of the present disclosure.
FIGS. 5B and 5C are cross sectional views taken along lines B"-B" and C"-C" of the gate trench structures of FIG. 5A.

FIG. 5A illustrates a further example in which the gates 184 and buried shielding structure 240 are "reversed" relative to FIG. 4A, such that the gates 184 (or gate trenches 180) linearly extend in the second lateral direction (e.g., the Y-direction), while the segments 245 of the buried shielding structure 240 extend in multiple lateral directions to define polygonal shapes in plan view. The sides of the respective polygons are illustrated as being shared by adjacent segments 245, but the polygons defined by the segments 245 may be laterally separated from one another in some embodiments. Respective well regions 170 and/or contact shielding regions may be provided between the gates 184 or gate trenches 180. More generally, the buried shielding structure 240 and/or the gates 184/gate trenches 180 may define patterns including segments 245 that provide linear, elliptical, or polygonal shapes in plan view.

The patterns 340, 340', 440, 440', and 540 shown in FIGS. 3A, 3E, 4A, 4D, and 5A may include segments 245 having relatively fine lateral dimensions with comparatively wide spacings therebetween, so as to reduce or minimize obstruction of the active conduction area of the semiconductor structure. For example, a respective width of the one or more segments 245 along the direction in which the gates 184 (or gate trenches 180) extend) may be between about 0.1 and 20 microns.

Figures 3B, 3C:
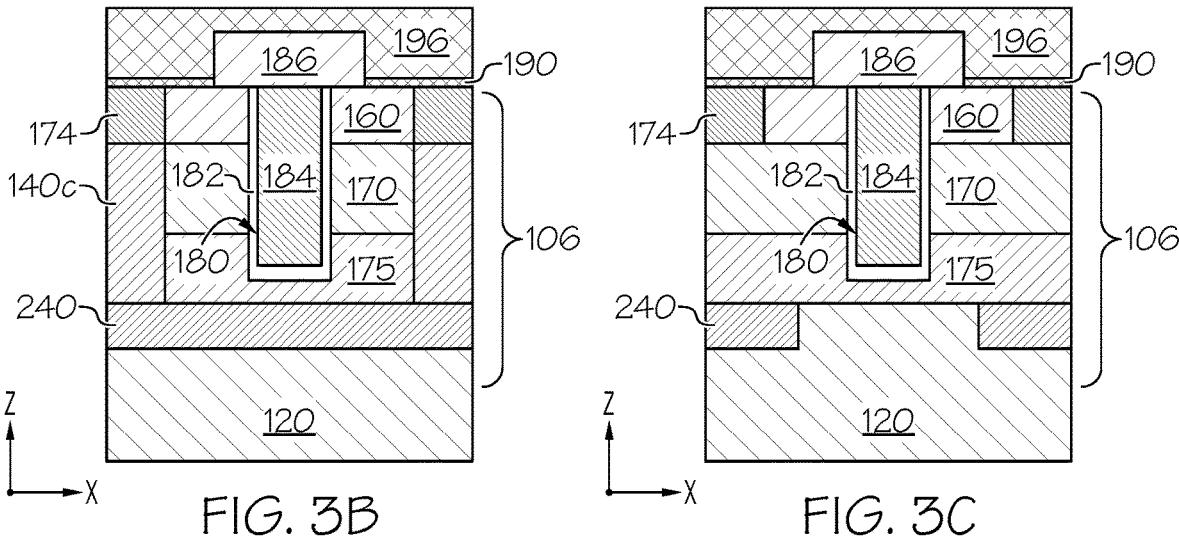
FIGS. 3B, 3C, and 3D are cross sectional views taken along lines B-B, C-C, and D-D of the gate trench structures of FIG. 3A or 3E.
Figure 3D:
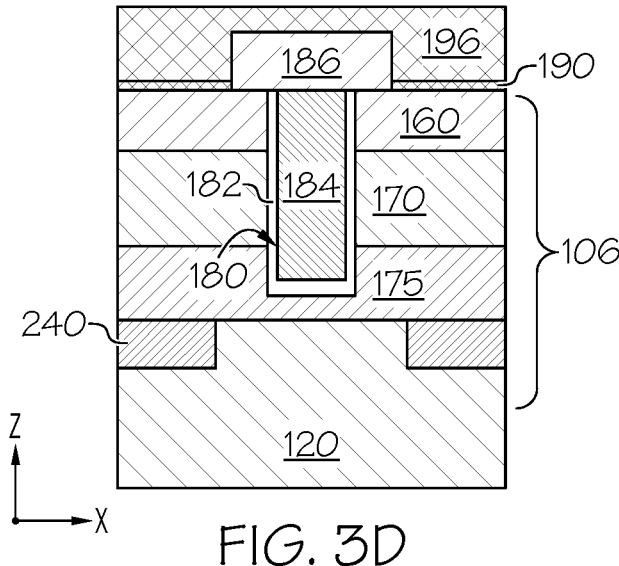
Figure 3E:
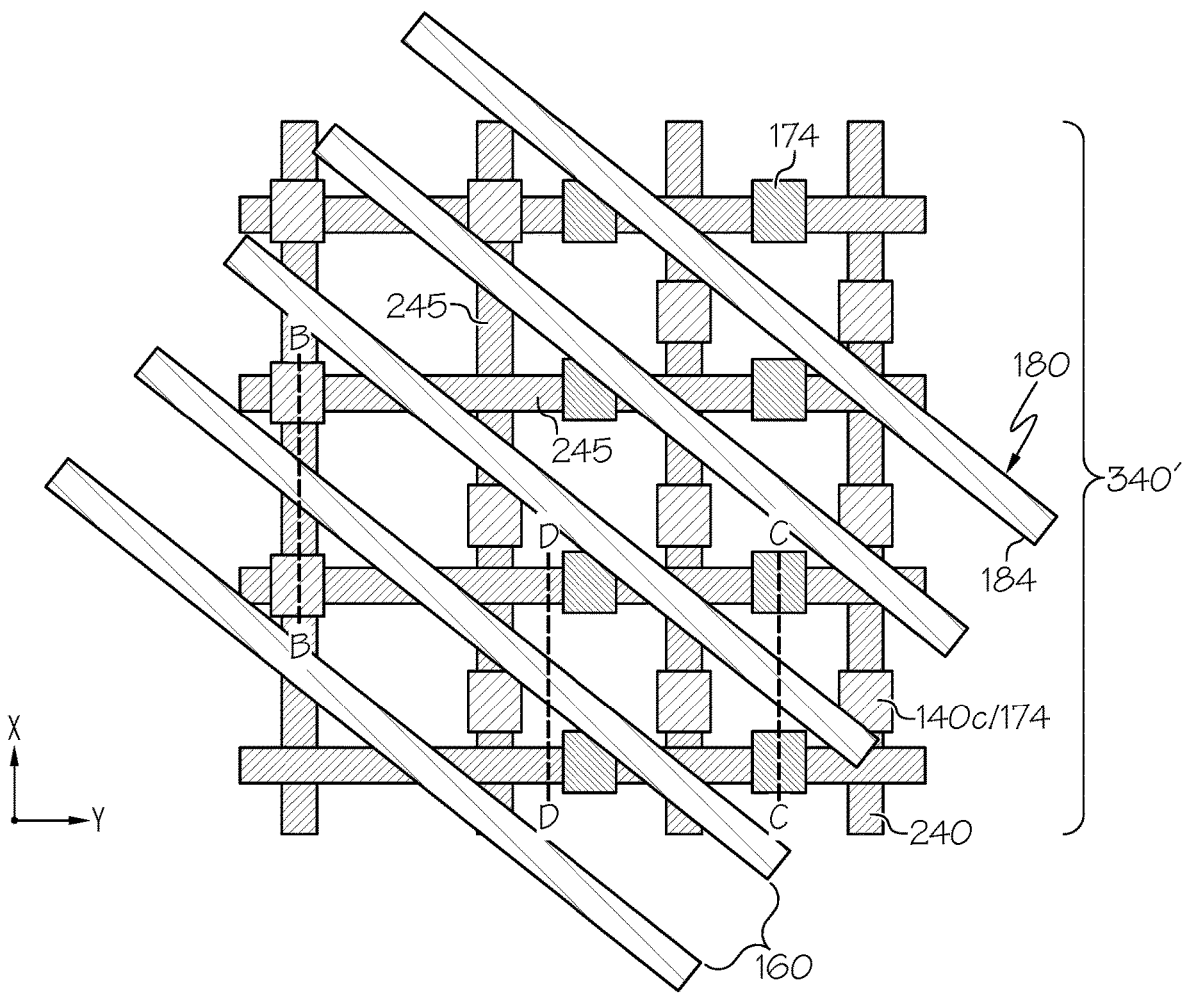

FIGS. 3B, 3C, and 3D are cross sectional views taken along lines B-B, C-C, and D-D of the gate trench structures of FIG. 3A or 3E. FIGS. 4B and 4C are cross sectional views taken along lines B'-B' and C'-C' of the gate trench structures of FIG. 4A or 4D. FIGS. 5B and 5C are cross sectional views taken along lines B''-B'' and C''-C'' of the gate trench structures of FIG. 5A. In particular, FIGS. 3C, 4C, and 5C illustrate portions of the active area of the semiconductor layer structure 106 providing a primary conduction path from source to drain (also referred to herein as vertical conduction areas), while FIGS. 3B, 4B, and 5B illustrate portions of the active area of the semiconductor layer structure 106 providing both a conduction path and electrical connections to the buried shielding structure 240 (also referred to herein as lateral conduction areas).

As shown in FIGS. 3B, 4B, and 5B, in the lateral conduction areas, the buried shielding structure 240 may extend under (e.g., so as to at least partially overlap in the vertical or Z-direction) the well region 170 and/or under a bottom surface of the gate 184, and may be spaced apart or separated from the well region 170 and/or gate 184 by a portion 175 of the drift region 120. The buried shielding structure 240 laterally extends in the drift region 120 from under the well region 170 and/or gate 184 to at least one contact shielding structure 140c, which provides electrical connection to the source region 160 and the source contact 190 (or segment thereof) at the top surface S of the semiconductor structure. In the lateral conduction areas, the buried shielding structure 240 may laterally extend so as to completely or partially vertically overlap (in the Z-direction) with the gates 184, depending on the direction(s) of lateral extension of the segments 245 of the buried shielding structure 240 and the gates 184. In contrast, as shown in FIGS. 3C, 4C, and 5C, in the vertical conduction areas, the buried shielding structure 240 may vertically overlap with the well regions 170, but does not extend completely under the gate 184 (i.e., the buried shielding structure 240 may at most partially vertically overlap with the gates 184 in the Z-direction), thereby increasing the area of the semiconductor layer structure 106 that is available for conduction. As shown in FIGS. 4C and 5C, additional shallow contact structures 174 of the second conductivity type (e.g., P+ regions) may be provided in the vertical conduction areas for electrical contact to the well regions 170.

Figure 6:
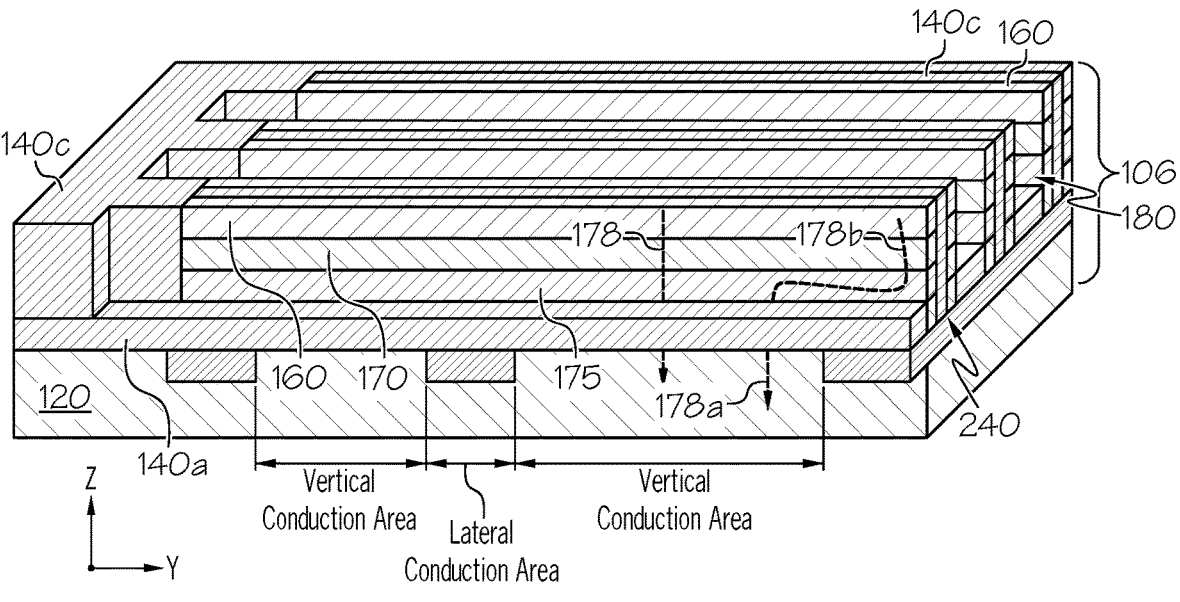
FIG. 6 is a perspective view illustrating a gate trench power semiconductor device including buried shielding structures according to some embodiments of the present disclosure.

FIG. 6 is a perspective view illustrating lateral conduction areas and vertical conduction areas in a gate trench power semiconductor device 600 including a buried shielding structure 240 according to some embodiments of the present disclosure. As shown in FIG. 6, in some embodiments, the buried shielding structure 240 may include segments 245 that laterally extend in a first direction, and the contact shielding structures 140c may continuously extend in a second direction, laterally spaced apart from the gate trenches 180 in the first direction. A bottom shielding structure 140a of the second conductivity type may extend under the bottom surface of a respective gate trench. The buried shielding structure 240 laterally extends in the first direction from the bottom shielding structure 140a to one (or more) of the contact shielding structures 140c.

FIG. 6 further illustrates that the buried shielding structure 240 may be configured to provide a lateral conduction path in a portion 175 of the drift region 120 (e.g., the JFET region 175) between the bottom of the gate trench 180 and the buried shielding structure 240. In particular, the segments 245 of the buried shielding structure 240 are laterally spaced apart (in this example, along the Y-direction) such that at least a part of an electrical conduction path 178 between the well region 170 and the drain contact 192 laterally extends along the buried shielding structure 240 in the second lateral direction (e.g., the Y-direction). The electrical conduction path 178 thus includes at least a first conduction path 178a in a vertical (Z-) direction, a second conduction path 178b in a lateral (Y-) direction, and a third conduction path in the vertical (Z-) direction. That is, the buried shielding structure 240 defined by the patterns 340, 340', 440, 440', 540 may have one or more dimensions (in the lateral or vertical directions) that allow for lateral conduction (e.g., into or out of the page in the cross-sections of FIG. 3B, 4B, or 5B) around the relatively narrow segments 245 thereof to the drain contact 192.

In some embodiments, the segments 245 of the buried shielding structure 240 may have comparatively wide spacings therebetween, and may have relatively narrow widths in one or more lateral directions, such that the vertical conduction area of the semiconductor structure may be increased or maximized. That is, in any of the examples described herein, the lateral widths of the segments 245 of the buried shielding structure 240 may be reduced (and/or the lateral spacings between segments 245 of the buried shielding structure 240 may be increased) to increase the area of the semiconductor layer structure 106 that is available for electrical conduction. For example, a respective width of a segment of the buried shielding structure 240 along the second lateral direction (e.g., the Y-direction) may be between about 0.1 and 20 microns. Similarly, the number of contact shielding structures 140c may be reduced and/or the lateral spacings between contact shielding structures 140c(or segments 245 thereof) may be increased to provide desired or optimized performance.

Figure 7:
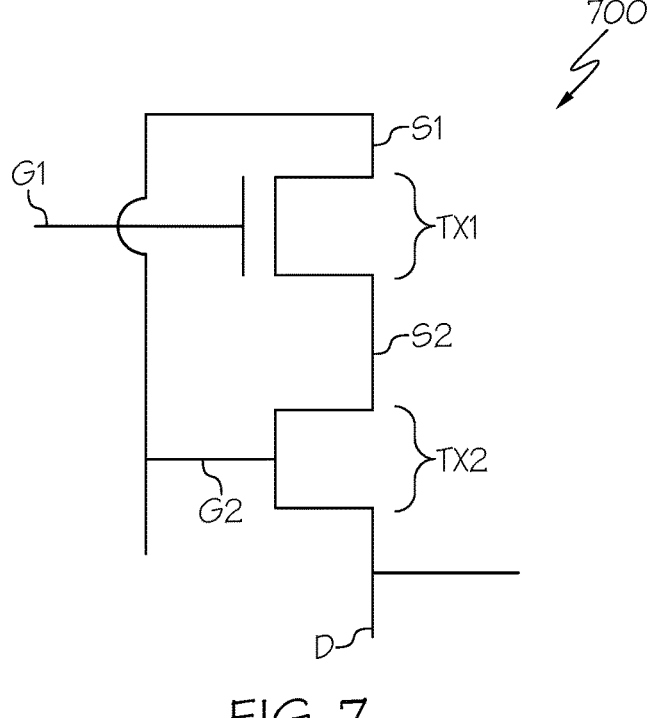
FIG. 7 is an equivalent circuit diagram illustrating transistor configurations that may be implemented in a power semiconductor device including buried shielding structures according to some embodiments of the present disclosure.

FIG. 7 is an equivalent circuit diagram illustrating transistor configurations 700 that may be implemented using buried shielding structures 240 according to some embodiments of the present disclosure. Referring to the equivalent circuit diagram of FIG. 7 and the cross sectional views of FIGS. 2A and 2B, a semiconductor layer structure 106 includes a first surface S with the gate 184 adjacent thereto (whether on the surface S or in a gate trench 180 in the surface S), and an opposing second surface with the drain contact 192 thereon. The semiconductor layer structure 106 includes a first transistor TX1 and a second transistor TX2 that are electrically coupled (e.g., in a cascode amplifier configuration 700) between the first and second surfaces.

In detail, the source region, the well region 170, and a first portion 120a of the drift region 120 (between the well region 170 and the buried shielding structure 240) provide a first pair of p-n junctions 160/170/175 defining the first transistor TX1 in the semiconductor layer structure 106. The first portion 120a of the drift region 120, the buried shielding structure 240, and a second portion 120b of the drift region 120 (between the buried shielding structure 240 and the drain contact 192) provide a second pair of p-n junctions 175/240/120 defining the second transistor TX2 in the semiconductor layer structure 106. As such, the source region 160 provides a first source S1 of the first transistor TX1, and the first portion 120a of the drift region 120 (i.e., the JFET region 175) provides a second source S2 of the second transistor TX2. The gate 184 provides a first gate G1 of the first transistor TX1, and the buried shielding structure 240 provides a second gate G2 of the second transistor TX2. The second gate G2 of the second transistor TX2 (provided by the buried shielding structure 240) is electrically coupled (by the contact shielding region) to the first source S1 of the first transistor TX1 (provided by the source region), thereby providing the cascode amplifier configuration 700.

Figure 8D:
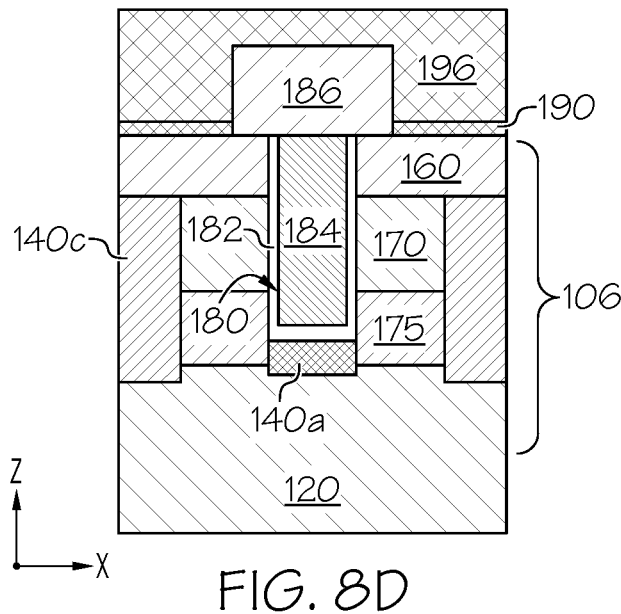
Figure 9A:
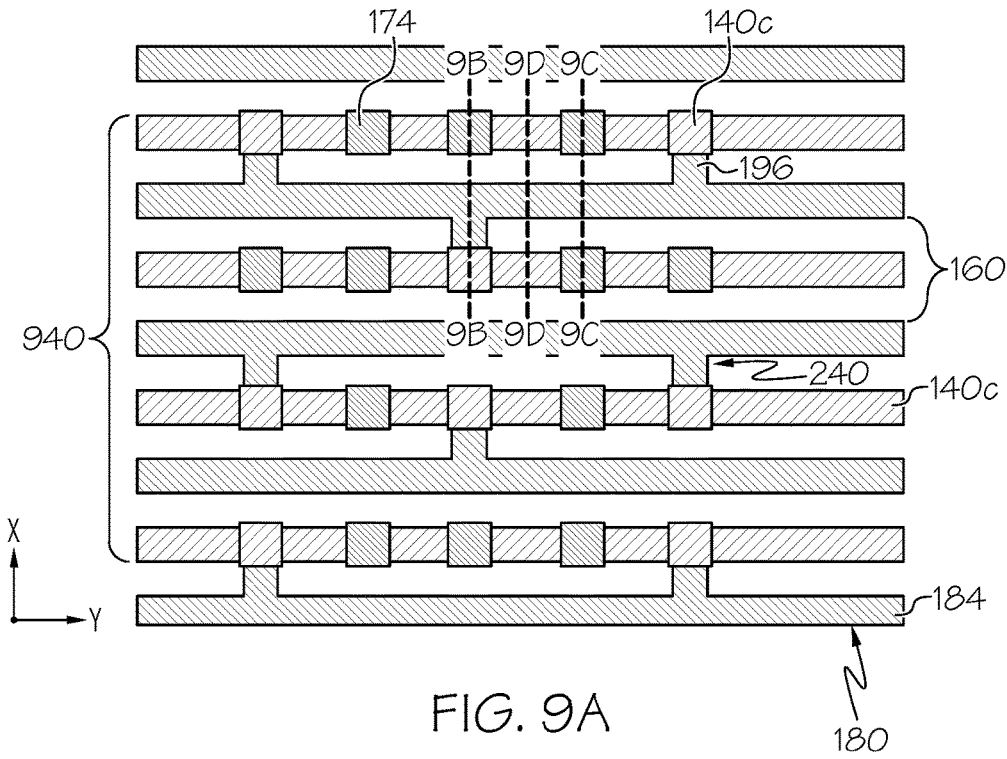
FIG. 9A is a plan view illustrating patterns of buried shielding structures and gate electrodes according to some embodiments of the present disclosure.
Figure 10A:
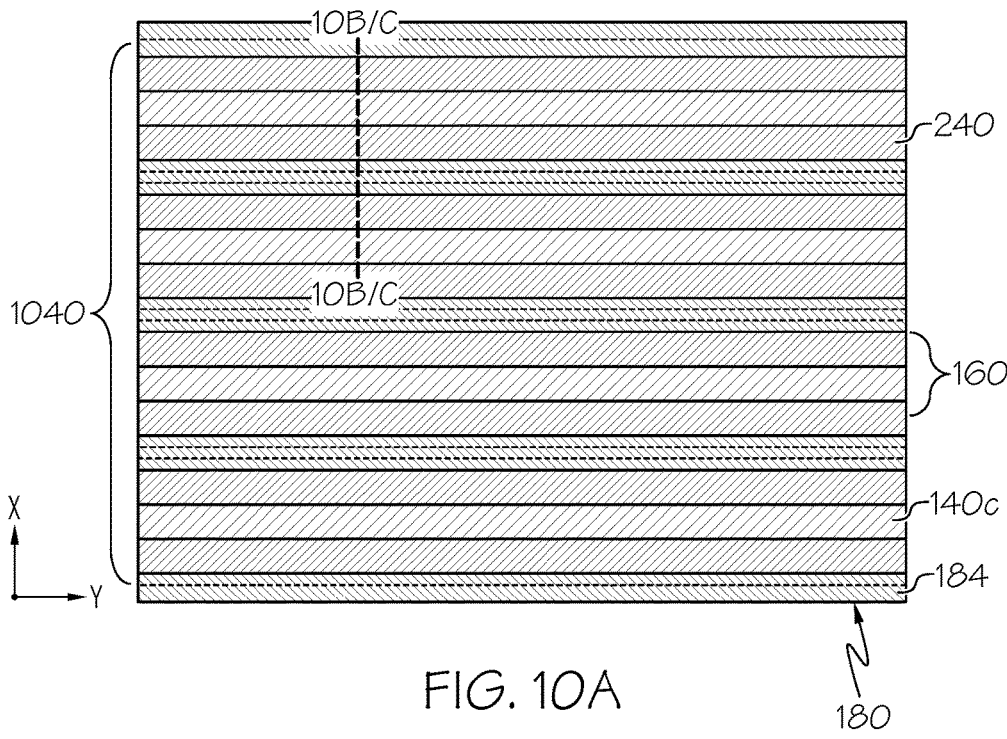
FIG. 10A is a plan view illustrating patterns of buried shielding structures and gate electrodes according to some embodiments of the present disclosure.

FIGS. 8A, 9A, and 10A, are plan views illustrating semiconductor devices 800, 900, 1000 including example patterns 840, 940, 1040 of buried shielding structures 240 and gate electrodes 184 extending in gate trenches 180 according to some embodiments of the present disclosure. As shown in FIGS. 8A, 9A, and 10A, the gates 184 and the contact shielding structures 140c continuously extend substantially parallel to one another in one lateral direction (e.g., the Y-direction), and the buried shielding structures 240 include patterns 840, 940, 1040 with segments 245 that discontinuously extend in a different lateral direction (e.g., the X-direction). However, it will be understood that embodiments of the present disclosure are not limited to the arrangements or patterns shown. For example, embodiments may include gates 184 and/or contact shielding structures 140c that are discontinuous or segmented in one or more lateral directions, segments 245 of the buried shielding structures 240 that are continuous in one or more lateral directions, or combinations thereof, with linear, elliptical, or polygonal shapes.

Figures 9B, 9C:
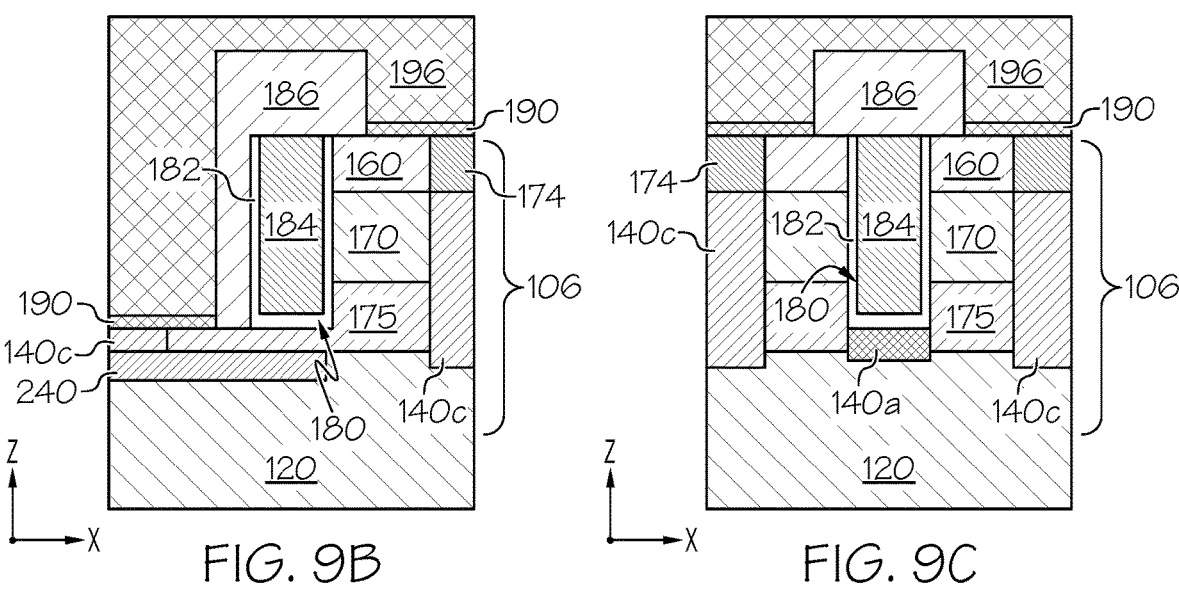
FIGS. 9B, 9C, and 9D are cross sectional views taken along lines 9B-9B, 9C-9C, and 9D-9D of the gate trench structures of FIG. 9A.
Figure 9D:
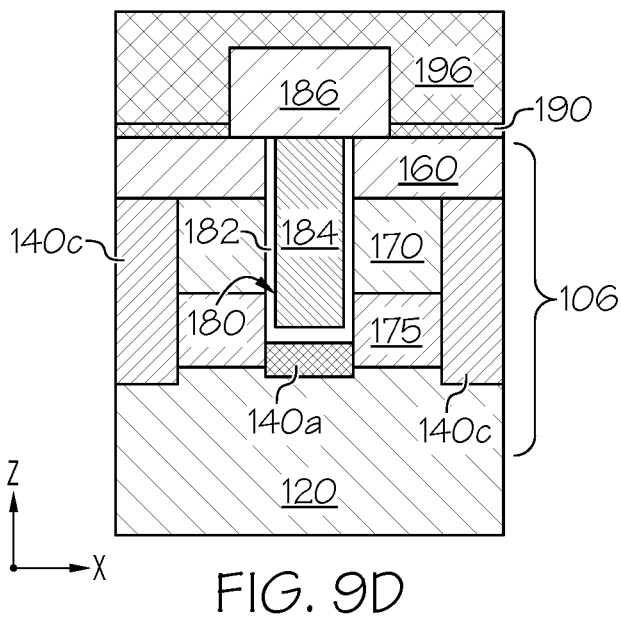

FIGS. 8B, 8C, and 8D are cross sectional views taken along lines 8B-8B, 8C-8C, and 8D-8D of the gate trench structures of FIG. 8A. FIGS. 9B, 9C, and 9D are cross sectional views taken along lines 9B-9B, 9C-9C, and 9D-9D of the gate trench structures of FIG. 9A. In particular, FIGS. 8C and 9C illustrate cross-sections of the vertical conduction areas, while FIGS. 8B and 9B illustrate cross-sections of the lateral conduction areas.

As shown in FIGS. 8B and 9B, in the lateral conduction areas, the buried shielding structure 240 laterally extends under the well region 170 and under a bottom surface of the gate 184, and is spaced apart or separated from the well region 170 by a portion 175 of the drift region 120. At least one contact shielding structure 140c of the second conductivity type vertically extends into the drift region 120 laterally spaced apart from the sidewalls of the gate trench 180 to contact the buried shielding structure 240, to provide electrical connection to a source contact 190 (or segment thereof) that is electrically coupled to the source region 160 at the top surface S of the semiconductor structure.

In the example of FIG. 8B, a bottom shielding structure 140a extends under the bottom surface of the gate trench, and the buried shielding structure 240 laterally extends from the bottom shielding structure 140a at the bottom of the gate trench 180 to at least one contact shielding structure 140c, thereby electrically coupling the buried shielding structure 240 and the bottom shielding structure 140a to the source contact. In some embodiments, the contact shielding structure 140c (shown as extending along the Y-direction) may also include segments 245 extending along the X-direction on one or both sidewalls of the gate trench 180 (i.e., forming a one-sided or two-sided "bridge") in the lateral conduction areas. However, this arrangement may prevent conduction on one or both sides of the gate trench.

In the example of FIG. 9B, the buried shielding structure 240 is electrically coupled to the source contact 190 by a portion of the metal layer 196 on the source contact 190 (also referred to as the source contact metal). In particular, the source contact metal 196 extends laterally (in the X-direction) and vertically (in the Z-direction) along at least one of the sidewalls of the gate trench 180 to contact the buried shielding structure 240 (or a remaining portion of the contact shielding structure 140c in contact therewith). The source contact metal 196 may be separated from the sidewall(s) of the gate trench 180 by an interlayer dielectric material. This arrangement may likewise prevent conduction on one or both sides of the gate trench.

As shown in FIGS. 8C and 9C, in the vertical conduction areas, the buried shielding structure 240 does not extend under the gate 184, so as to increase the area of the semiconductor layer structure 106 that is available for conduction. In particular, the segments 245 of the buried shielding structure 240 are laterally spaced apart to define a relatively sparse pattern such that the buried shielding structure 240 is largely absent from the vertical conduction areas. The bottom shielding structure 140a may extend under the gate trench 180 in the vertical conduction areas, to reduce electric field levels in the gate insulating layer, particularly at corners of the gate trench.

Figures 10B, 10C:
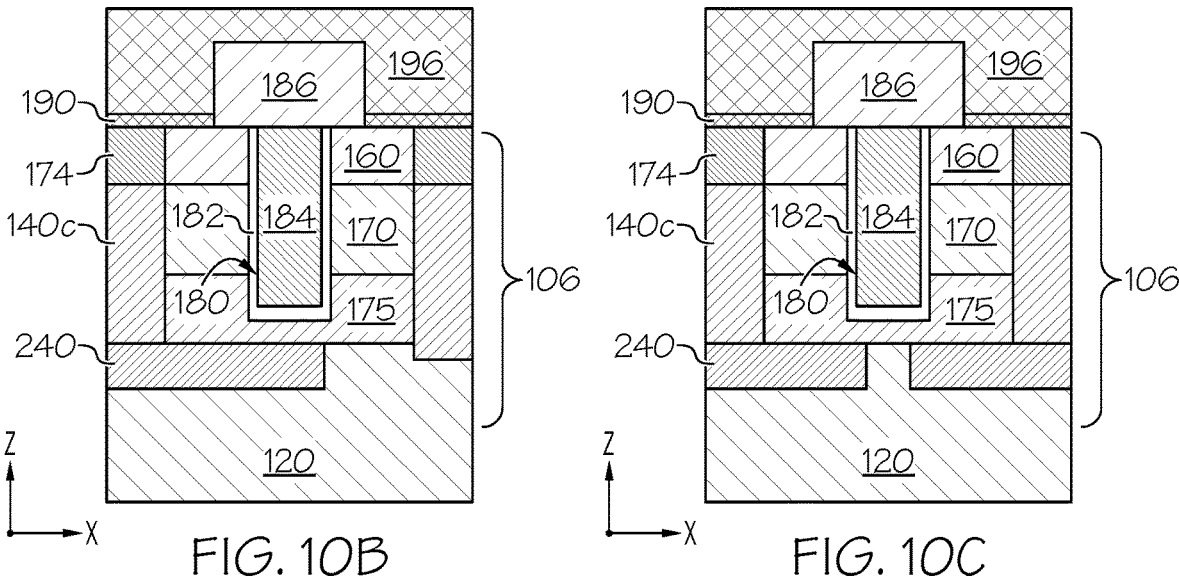
FIGS. 10B and 10C are alternative examples of cross sectional views taken along line 10B/C-10B/C of the gate trench structure of FIG. 10A.

FIGS. 10B and 10C are alternative examples of cross sectional views taken along line 10B/C-10B/C of the gate trench structure of FIG. 10A. In particular, FIGS. 10B and 10C illustrate alternative examples of vertical conduction areas in which the buried shielding structure 240 laterally extends under the well region 170 to at least partially vertically overlap (in the Z-direction) with the bottom of the gate trench. In some embodiments, the buried shielding structure 240 may extend under and spaced apart from the well region 170 at one side (in FIG. 10B) or both sides (in FIG. 10C) of the gate 184, in some embodiments over a majority of the drift region 120 between the contact shielding structures 140c and the gate 184.

More particularly in the example of FIG. 10B, the buried shielding structure 240 may laterally extend from a contact shielding structure 140c to under the bottom of the gate trench 180 at one side of the gate trench. The other side of the gate trench 180 (and the associated electrical conduction path 178 along the sidewall thereof and in the vertical direction) may be free of the buried shielding structure 240. In the example of FIG. 10C, the buried shielding structure 240 may laterally extend from respective contact shielding structure 140c to under the bottom of the gate trench 180 at opposing sides of the gate trench, but includes gaps or openings under the gate trench 180 to allow current flow in the vertical direction. Electrical conduction in the lateral direction (i.e., a lateral conduction path into or out of the page in the cross sectional views of FIGS. 8C, 9C, and 10C) may also be provided in a portion 175 of the drift region 120 (e.g., the JFET region 175) between the bottom of the gate trench 180 and the buried shielding structure 240. That is, the buried shielding structure 240 defined by the patterns 840, 940, 1040 may have one or more dimensions (in the lateral or vertical directions) that allow for lateral conduction around the relatively narrow segments 245 thereof to the drain contact 192, as similarly described above with reference to FIG. 3B, 4B, or 5B.

FIGS. 11A-11E, 12A-12F, 13A-13E, 14A-14D, and 15A-15D illustrate various examples of methods of fabricating semiconductor devices including buried shielding structures 240 according to some embodiments of the present disclosure. In FIGS. 11A to 15D, methods of fabricating a semiconductor device include providing a drift region 120 of a first conductivity type, providing a buried shielding structure 240 of a second conductivity type in the drift region 120, and providing a well region 170 of the second conductivity type above the drift region 120 and separated from the buried shielding structure 240. The buried shielding structure 240 may be formed using selective epitaxy, ion implantation, etching, and/or combinations thereof. The buried shielding structure 240 may be formed in various patterns having one or more segments 245 that laterally extend in the drift region 120. While not illustrated, a gate 184 is provided on the semiconductor layer structure 106 adjacent the well region 170 (e.g., in the gate trench 180 in the device of FIG. 11A-13E or 15A-15D or on the surface S in the planar gate device of FIGS. 14A-14D).

Figure 11A:
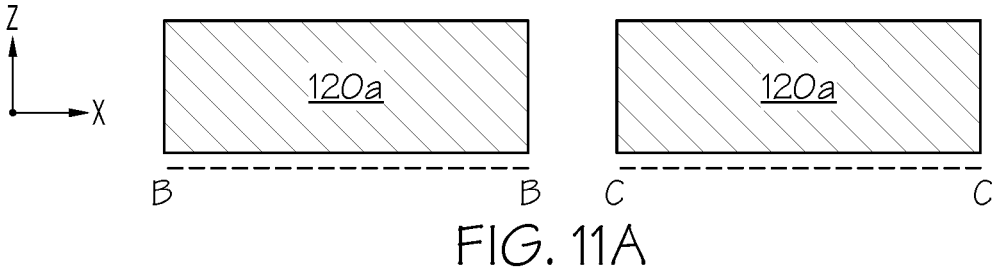
FIGS. 11A, 11B, 11C, 11D, and 11E are cross sectional views taken along lines B-B and C-C of the gate trench structure of FIG. 3A illustrating methods of fabricating power semiconductor devices including buried shielding structures according to some embodiments of the present disclosure.
Figure 11B:
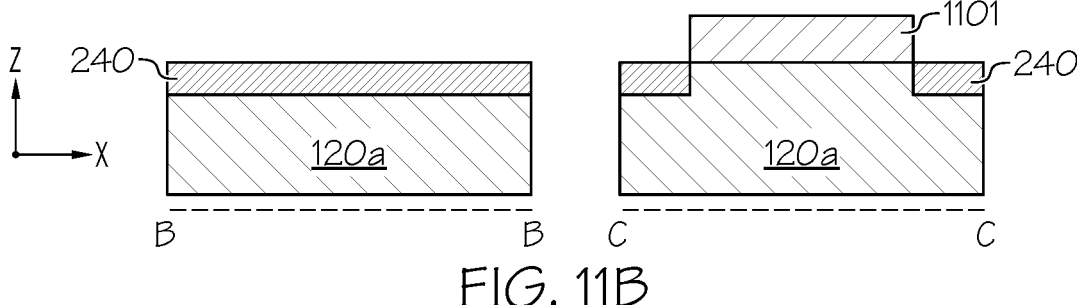

In particular, FIGS. 11A-11E are cross sectional views taken along line B-B (illustrating lateral conduction areas) and along line C-C (illustrating vertical conduction areas) of the gate trench structure of FIG. 3A, which illustrate methods of fabricating power semiconductor devices including buried shielding structures according to some embodiments of the present disclosure. As shown in FIG. 11A, a first portion of a drift region 120 having a first (e.g., n−) conductivity type is formed, for example, by a first epitaxy process. In FIG. 11B, a buried shielding structure 240 having a second (e.g., p−) conductivity type is formed in or on the first portion 120a of the drift region 120. In particular, a mask pattern 1101 is formed on the first portion 120a of the drift region 120. For example, a patterning layer may be formed on a mask layer, and the mask layer may be patterned (e.g., photolithographically) using the patterning layer to form a mask pattern 1101 including openings therein exposing portions of the drift region 120, with comparatively greater portions exposed in the lateral conduction areas (along line B-B) than in the vertical conduction areas (along line C-C).

The buried shielding structure 240 may be formed in a desired pattern (such as, but not limited to, the patterns 340, 440, 540, 840, 940, 1040 described herein) based on the areas of the drift region 120 that are exposed by the mask pattern 1101. In some embodiments, one or more ion implantation processes may be performed to selectively implant dopants of the second conductivity type (e.g., p-type) into the areas of the drift region 120 exposed by the mask pattern 1101 to form the buried shielding structure 240 in the desired pattern, using the mask pattern 1101 as an implantation mask. The dopant concentration of the buried shielding structure 240 may be substantially uniform or graded (e.g., stepwise or continuous).

Figure 11C:
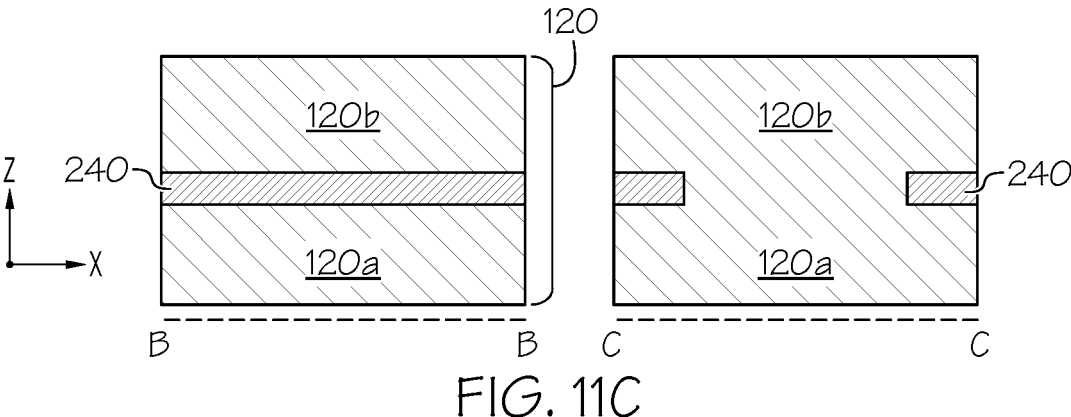
Figure 11D:
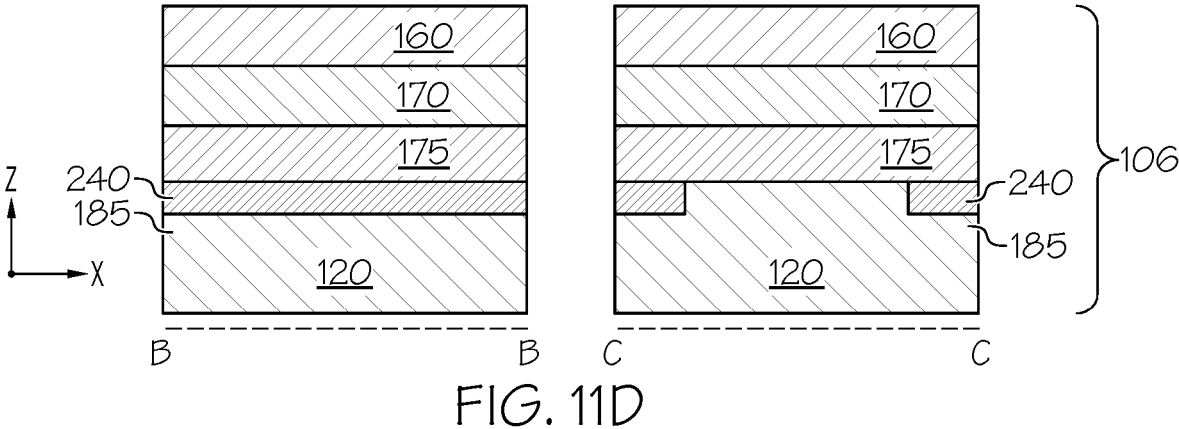

In FIG. 11C, the mask pattern 1101 is removed, and a second portion 120b of the drift region 120 having the first conductivity type is formed on the buried shielding structure 240 (e.g., by a second epitaxy process). In FIG. 11D, a JFET region 175 of the first conductivity type, a well region 170 of the second conductivity type, and a source region 160 of the first conductivity type are formed in or on the second portion 120$b$ of the drift region 120. For example, the JFET region 175, the well region 170, and the source region 160 may be formed in the second portion 120$b$ of the drift region 120 by respective masking and/or ion implantation processes. In some embodiments, additional shallow contact structures 174 of the second conductivity type (e.g., P+ regions) may be formed adjacent the source region 160 to provide electrical contact to the well region 170 170. A semiconductor layer structure 106 including the drift region 120, well region 170, and source region 160 is thereby provided.

Figure 11E:
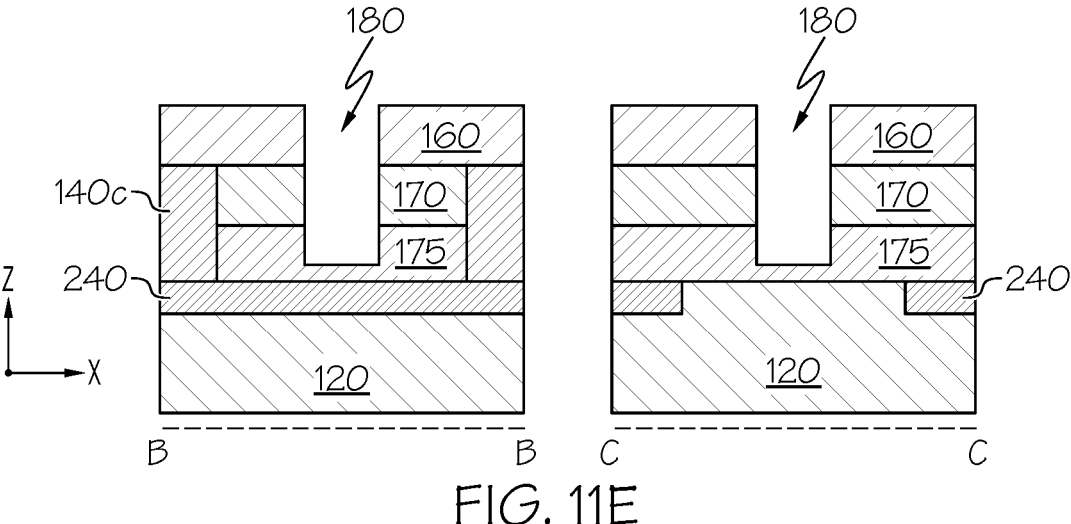

As shown in FIG. 11E, contact shielding structures 140$c$ and gate trenches 180 are formed extending into a surface S of the semiconductor layer structure 106. For example, an etching process may be performed to selectively etch portions of the surface S exposed by an etching mask pattern 1101 (not shown) to form gate trenches 180 extending into the drift region 120 120 between and spaced apart from the contact shielding structures 140$c$.

In FIG. 11E, the contact shielding structures 140$c$ may be formed using various fabrication operations, before (pre-trench) or after (post-trench) forming the gate trenches 180. For example, in some embodiments, an implant mask (not shown) including openings therein exposing portions of the surface S of the semiconductor layer structure 106 may be formed, and one or more ion implantation processes may be performed to implant dopants of the second conductivity type (e.g., p-type) into the exposed portions of the surface to form the contact shielding structures 140$c$ extending into the drift region 120 toward the underlying substrate (e.g., 110). A dose and/or implantation energy of the implantation process(es) may be controlled to form the contact shielding structures 140$c$ with desired dopant concentrations and/or depths (e.g., D1) relative to the surface S (e.g., with higher implantation energies resulting in greater depths). The dopant concentrations of the contact shielding structures 140$c$ may be substantially uniform or graded.

In other embodiments, the contact shielding structures 140$c$ may be formed by forming an etch mask (not shown) including openings therein exposing portions of the surface S of the semiconductor layer structure 106, and performing one or more etching processes may be performed to form shield trenches extending into the exposed portions of the surface S with the desired depths (e.g., D1). One or more deposition processes may be performed to form a material of the second conductivity type (e.g., p-type) in the shield trenches, thereby forming the contact shielding structures 140$c$ of a different material than the drift region 120 (also referred to herein as heterojunction shielding structures) extending into the drift region 120 toward the underlying substrate (e.g., 110). For example, the drift region 120 may be formed of an n-type material (e.g., SiC), and the contact shielding structures 140$c$ may be formed of one or more p-type materials (e.g., p-NiO, p-poly-Si, p-GaN, p-Ga$_2$O$_3$).

In some embodiments, a bottom shielding structure (e.g., 140$a$) may be formed under and at least partially along a bottom surface of the gate trench, either before forming the gate trench 180 (e.g., in the same pre-trench process as forming the buried shielding structure 240) or after forming the gate trench 180 (e.g., using a low-energy post-trench implantation process) in some embodiments. As such, the bottom shielding structures 140$a$ may be implanted regions of (and thus, may include the same material as) the drift region 120, while the buried shielding structure 240 may be formed of a different material than the drift region 120, or vice versa. That is, when present, the bottom shielding structure 140$a$ and the buried shielding structure 240 may be formed using the same or different fabrication operations (e.g., the same or different ion implantation or epitaxial processes), and thus, may be the same as or may differ from one another (e.g., in materials, depth of extension toward the substrate 110, and/or dopant concentration), depending on the fabrication processes used. Likewise, the contact shielding structures 140$c$ may have different depths, dopant concentrations, and/or materials than the bottom shielding structures 140$a$ or the buried shielding structure 240. For example, the contact shielding structures 140$c$ may be formed with similar or higher dopant concentration (for example, $1\times10^{17}$ cm$^{-3}$ to $1\times10^{20}$ cm$^{-3}$) than the bottom shielding structures 140$a$ or the buried shielding structure 240 (for example, $1\times10^{17}$ cm$^{-3}$ to $5\times10^{19}$ cm$^{-3}$).

Still referring to FIG. 11E, after forming the gate trenches 180, gate insulating layers 182$a$ are formed along sidewalls and bottom surfaces of the gate trenches 180, and gate electrodes 184$a$ are formed in the gate trenches. Source contacts 190 (e.g., ohmic contacts), an intermetal dielectric 186, and a source metal layer 196 may be subsequently formed. The fabrication operations shown in FIGS. 11A-11E may thereby provide the device 200$a$ of FIG. 2A.

FIGS. 12A-12F are cross sectional views taken along line B-B (illustrating lateral conduction areas) and along line C-C (illustrating vertical conduction areas) of the gate trench structure of FIG. 3A, which illustrate methods of fabricating power semiconductor devices including buried shielding structures according to some embodiments of the present disclosure. The operations of FIGS. 12A-12F may be similar to those of FIGS. 11A-11E, except that the implantation or deposition processes of FIG. 11B are performed as a blanket implantation or epitaxy process without a mask pattern 1101, followed by a subsequent etching process using a mask pattern 1101 to form the buried shielding structure 240 in the desired pattern based on the areas of the drift region 120 that are exposed by the mask pattern 1101.

Figure 12A:
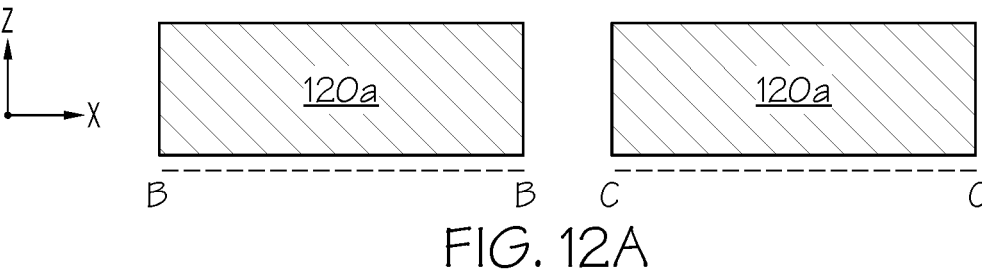
FIGS. 12A, 12B, 12C, 12D, 12E, and 12F are cross sectional views taken along lines B-B and C-C of the gate trench structure of FIG. 3A illustrating methods of fabricating power semiconductor devices including buried shielding structures according to some embodiments of the present disclosure.
Figure 12B:
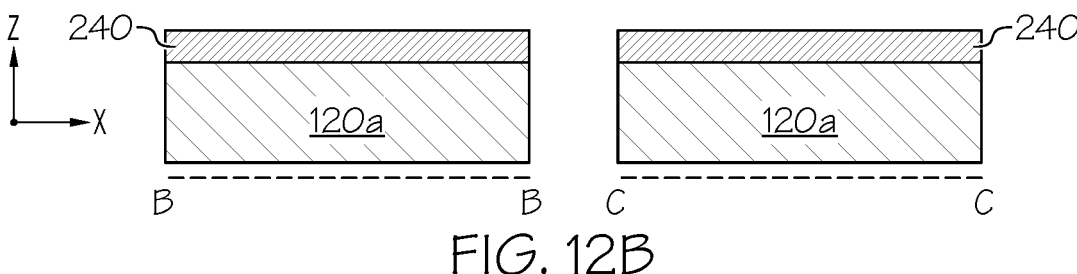

As shown in FIG. 12A, a first portion of a drift region 120 having a first (e.g., n−) conductivity type is formed, for example, by a first epitaxy process. In FIG. 12B, a buried shielding structure 240 having a second (e.g., p−) conductivity type is formed on the first portion 120$a$ of the drift region 120. In particular, a blanket implantation or epitaxy process is performed to implant or deposit a material of the second conductivity type on the first portion 120$a$ of the drift region 120 to form the buried shielding structure 240. The blanket process may be performed on a majority or entirety of an upper surface of the first portion 120$a$ of the drift region 120.

Figure 12C:
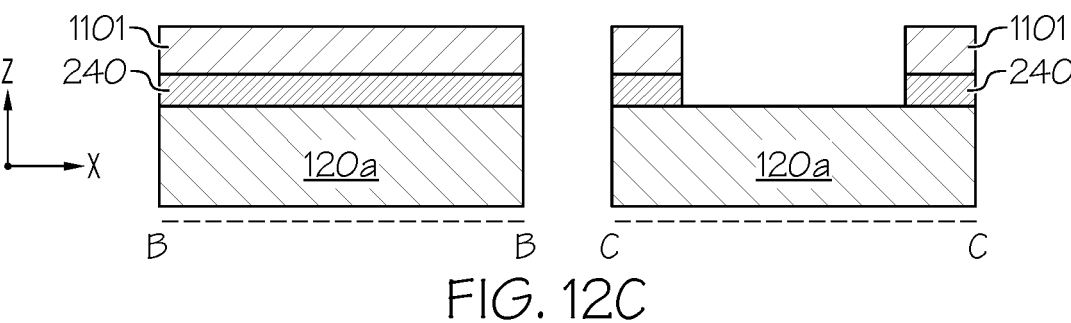

In FIG. 12C, after the implantation or epitaxy process, a mask pattern 1101 is formed on the first portion 120$a$ of the drift region 120, with openings that expose comparatively greater portions in the lateral conduction areas (along line B-B) than in the vertical conduction areas (along line C-C). An etching process is selectively performed on areas of the first portion 120$a$ of the drift region 120 using the mask pattern 1101 to form the buried shielding structure 240 in the desired pattern based on the areas of the drift region 120 exposed by the mask pattern 1101.

Figure 12D:
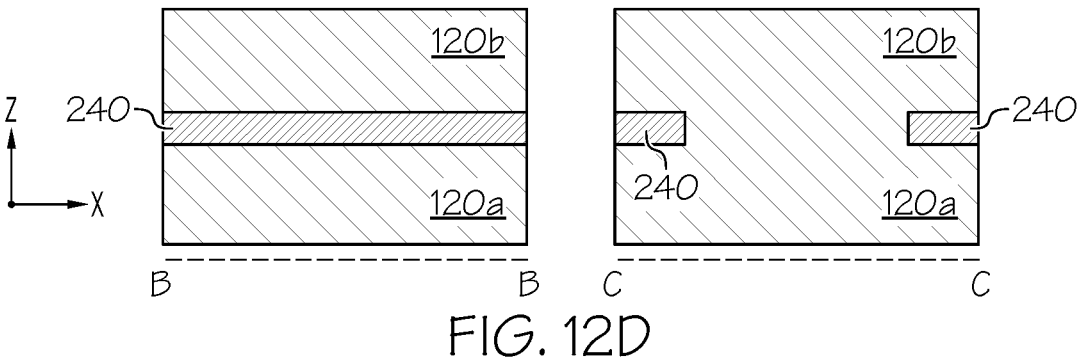
Figure 12E:
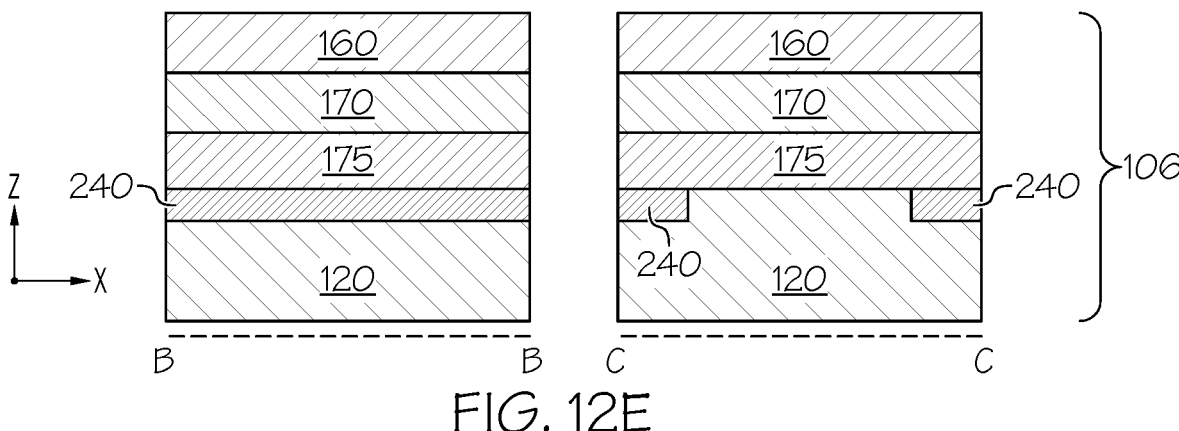
Figure 12F:
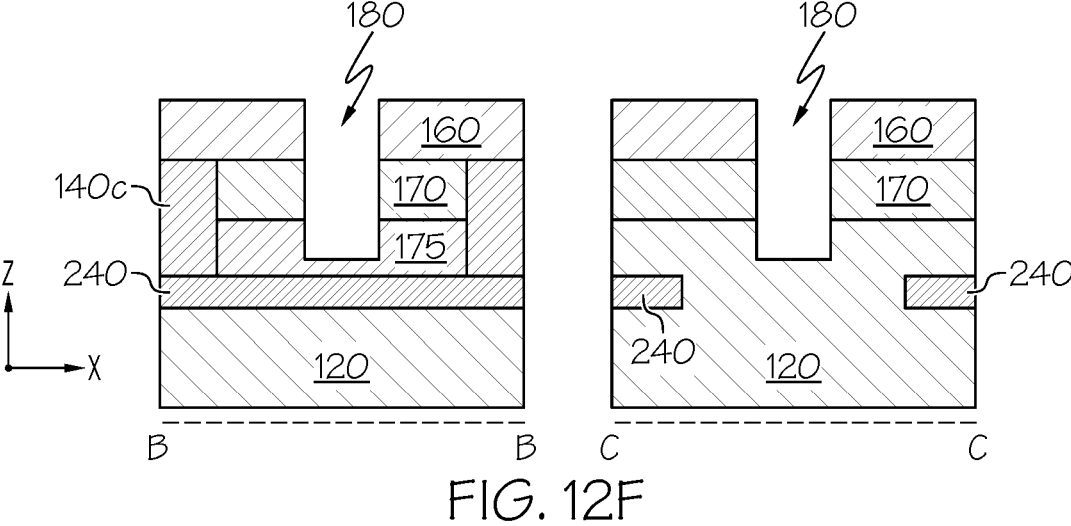

In FIG. 12D, the mask pattern 1101 is removed, and a second portion 120$b$ of the drift region 120 having the first conductivity type is formed on the buried shielding structure 240 (e.g., by a second epitaxy process). In FIG. 12E, a JFET region 175 of the first conductivity type, a well region 170 of the second conductivity type, and a source region 160 of the first conductivity type are formed in or on the second portion 120*b* of the drift region 120, and in FIG. 12F, contact shielding structures 140*c* and gate trenches 180 are formed extending into a surface S of the semiconductor layer structure 106, as similarly described above with reference to FIGS. 11A-11E. In some embodiments, bottom shielding structures (e.g., 140*a*) may be formed under and at least partially along bottom surfaces of the gate trenches. Gate insulating layers 182*a*, gate electrodes 184*a*, source contacts 190, intermetal dielectric 186, and metal layer 196 may be subsequently formed to provide the device 200*a* of FIG. 2A.

FIGS. 13A-13E are cross sectional views taken along lines B-B and C-C of the gate trench structure of FIG. 3A illustrating methods of fabricating power semiconductor devices including buried shielding structures according to some embodiments of the present disclosure. The operations of FIGS. 13A-13E may be similar to those of FIGS. 11A-11E, except that a current spreading layer or region may be formed above and/or below the buried shielding structure 240.

Figure 13A:
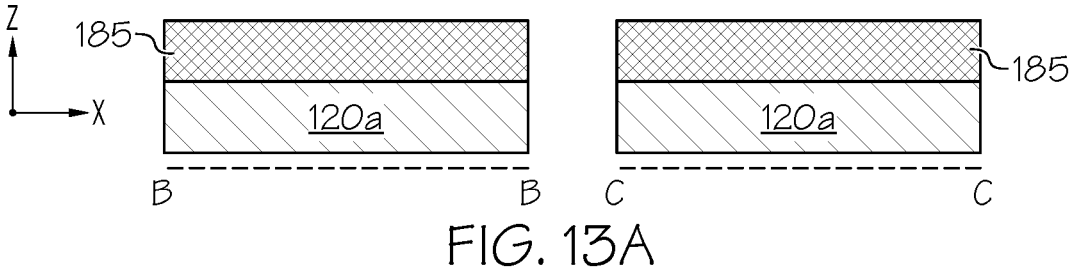
FIGS. 13A, 13B, 13C, 13D, and 13E are cross sectional views taken along lines B-B and C-C of the gate trench structure of FIG. 3A illustrating methods of fabricating power semiconductor devices including buried shielding structures according to some embodiments of the present disclosure.

As shown in FIG. 13A, a first portion of a drift region 120 having a first (e.g., n–) conductivity type is formed (e.g., by a first epitaxy process), and a current spreading region 185 having a greater concentration of dopants of the first conductivity type is formed in the first portion 120*a* of the drift region 120. For example, the current spreading region 185 may be an N+ region that is implanted into or otherwise formed on the first portion 120*a* of the drift region 120 using a selective or blanket process.

Figure 13B:
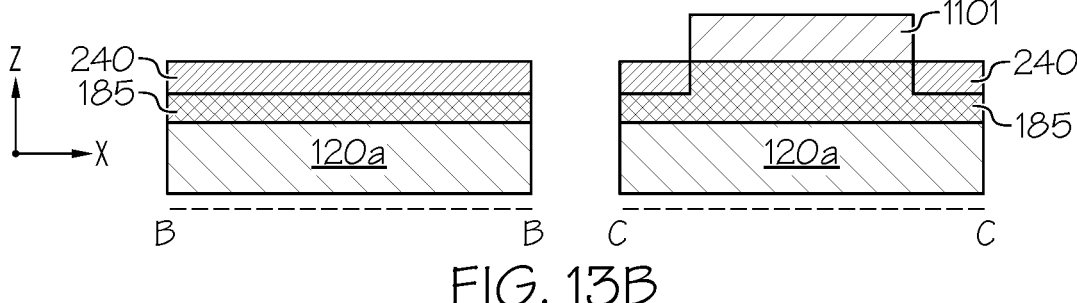

In FIG. 13B, a buried shielding structure 240 having a second (e.g., p–) conductivity type is formed in or on the first portion 120*a* of the drift region 120. In particular, a mask pattern 1101 is formed on the first portion 120*a* of the drift region 120 (e.g., on the current spreading region 185), and the buried shielding structure 240 is formed in a desired pattern based on the areas of the drift region 120 that are exposed by the mask pattern 1101. For example, the buried shielding structure 240 may be formed in or on portions of the current spreading region 185 using one or more ion implantation processes or selective epitaxy processes to implant or deposit material of the second conductivity type (e.g., p-type) into or on the areas exposed by the mask pattern 1101. The current spreading region 185 may thus extend above and/or below the buried shielding structure 240, relative to an underlying substrate (e.g., 110).

Figure 13C:
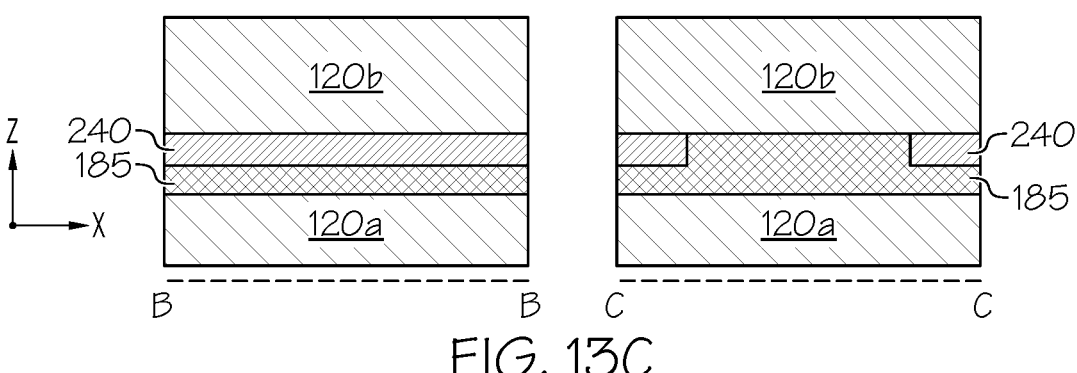
Figure 13D:
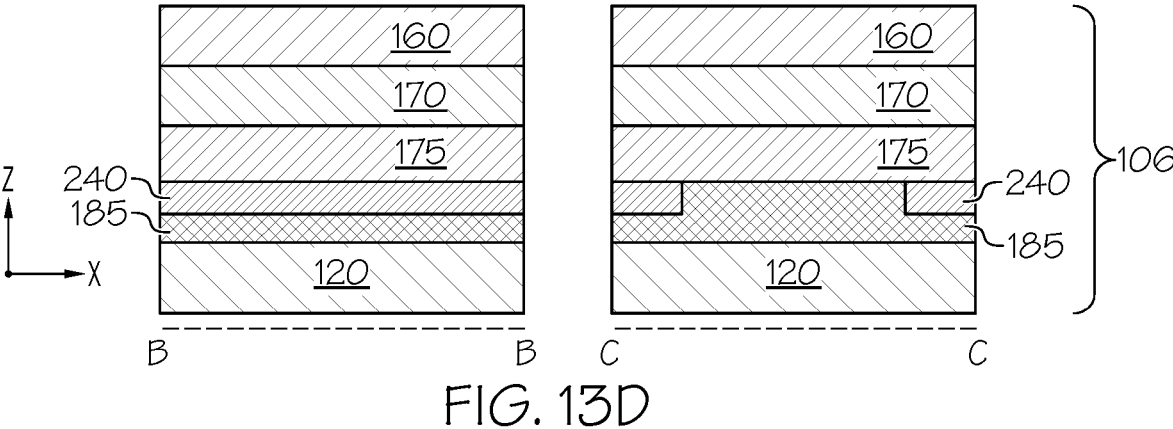
Figure 13E:
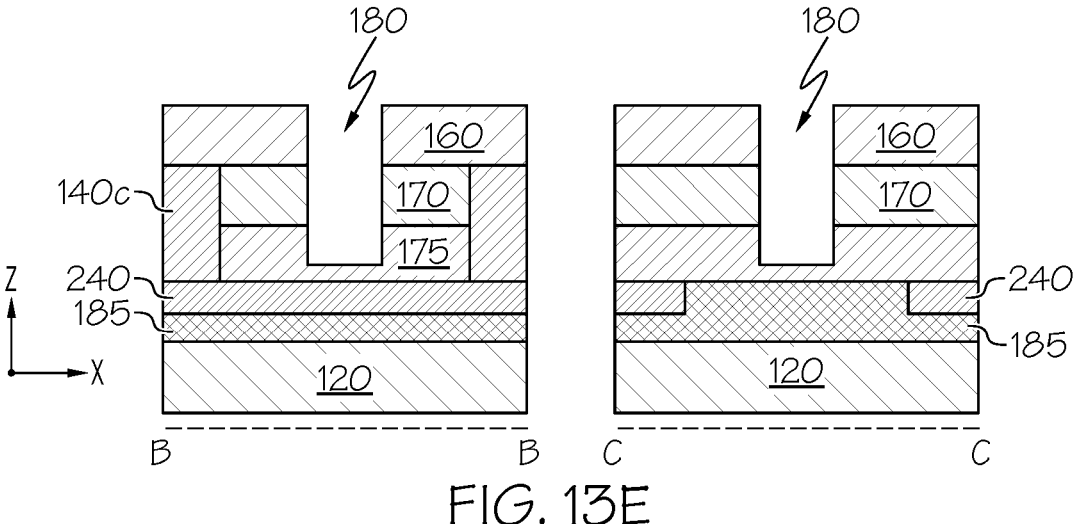

In FIG. 13C, the mask pattern 1101 is removed, and a second portion 120*b* of the drift region 120 having the first conductivity type is formed on the buried shielding structure 240 and/or on the current spreading region 185 (e.g., by a second epitaxy process). In FIG. 13D, a JFET region 175 of the first conductivity type, a well region 170 of the second conductivity type, and a source region 160 of the first conductivity type are formed in or on the second portion 120*b* of the drift region 120, and in FIG. 13E, contact shielding structures 140*c* and gate trenches 180 are formed extending into a surface S of the semiconductor layer structure 106, as similarly described above with reference to FIGS. 11A-11E.

The gate trenches 180 may be confined above the current spreading region 185 in some embodiments. In some embodiments, bottom shielding structures (e.g., 140*a*) may be formed under and at least partially along bottom surfaces of the gate trenches. Gate insulating layers 182*a*, gate electrodes 184*a*, source contacts 190, intermetal dielectric 186, and metal layer 196 may be subsequently formed to provide the device 200*a* of FIG. 2A.

FIGS. 14A-14D are cross sectional views taken along lines B-B and C-C of the planar gate structure of FIG. 3A illustrating methods of fabricating power semiconductor devices including buried shielding structures according to some embodiments of the present disclosure. The operations of FIGS. 14A-14D may be similar to those of FIGS. 11A-11E, except that the device is formed with a planar gate structure.

Figure 14A:
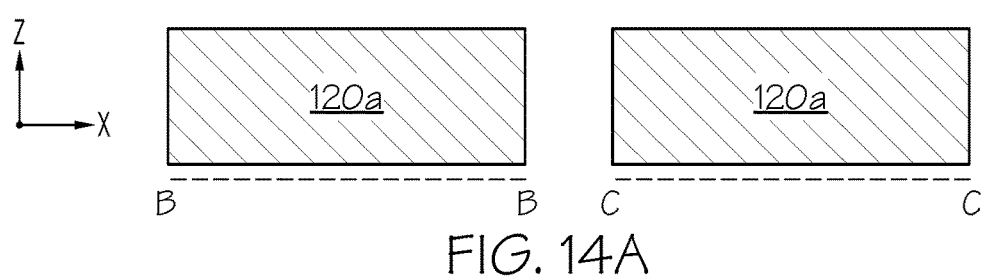
FIGS. 14A, 14B, 14C, and 14D are cross sectional views taken along lines B-B and C-C of the planar gate structure of FIG. 3A illustrating methods of fabricating power semiconductor devices including buried shielding structures according to some embodiments of the present disclosure.
Figure 14B:
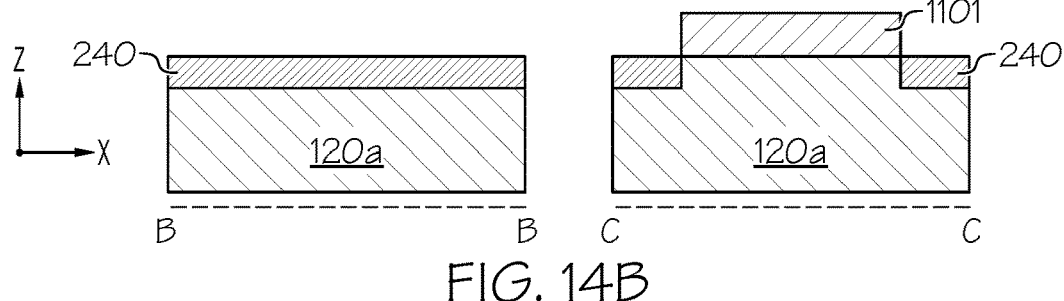

As shown in FIG. 14A, a first portion of a drift region 120 having a first (e.g., n–) conductivity type is formed (e.g., by a first epitaxy process). In FIG. 14B, a buried shielding structure 240 having a second (e.g., p–) conductivity type is formed in or on the first portion 120*a* of the drift region 120. In particular, a mask pattern 1101 is formed on the first portion 120*a* of the drift region 120, and the buried shielding structure 240 is formed in a desired pattern, for example, using one or more ion implantation processes or selective epitaxy processes to implant or deposit material of the second conductivity type into or on the areas exposed by the mask pattern 1101.

Figure 14C:
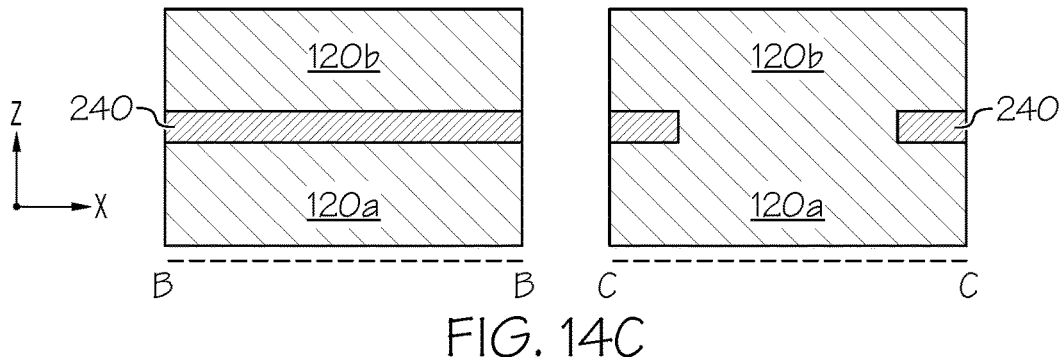
Figure 14D:
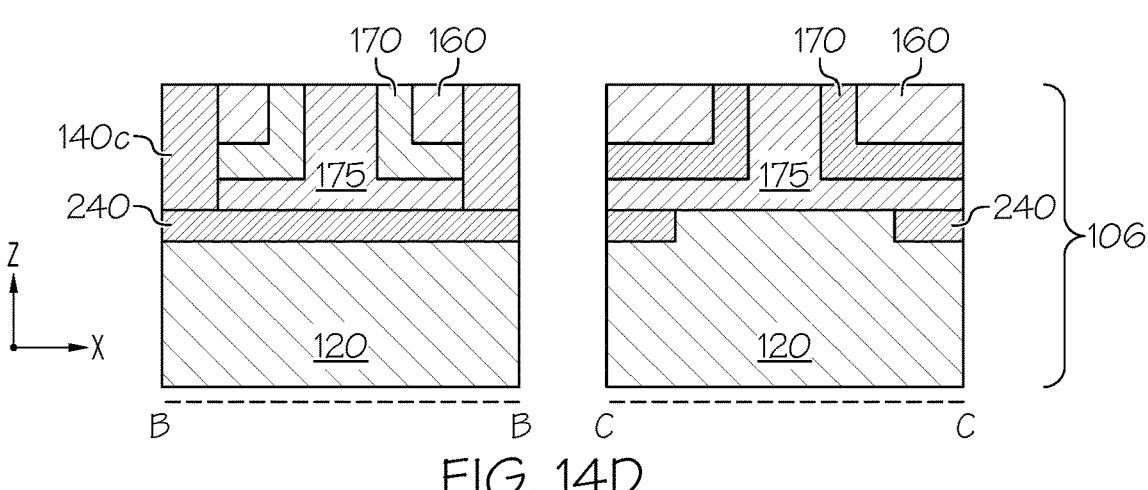

In FIG. 14C, the mask pattern 1101 is removed, and a second portion 120*b* of the drift region 120 having the first conductivity type is formed on the buried shielding structure 240 (e.g., by a second epitaxy process). In FIG. 14D, a JFET region 175 of the first conductivity type, well regions 170 of the second conductivity type, and source regions 160 of the first conductivity type are formed in or on the second portion 120*b* of the drift region 120, and contact shielding structures 140*c* are formed extending into a surface S of the semiconductor layer structure 106. Gate insulating layers 182*b*, gate electrodes 184*b*, source contacts 190, intermetal dielectric 186, and metal layer 196 may be subsequently formed to provide the device 200*b* of FIG. 2B.

FIGS. 15A, 15B, 15C, and 15D are cross sectional views taken along lines B-B and C-C of the gate trench structure of FIG. 3A illustrating methods of fabricating power semiconductor devices including buried shielding structures according to some embodiments of the present disclosure. The operations of FIGS. 15A-15D may be similar to those of FIGS. 11A-11E, except that the buried shielding structure 240 is formed by one or more deep ion plantation processes.

Figures 15A, 15B, 15C, 15D:
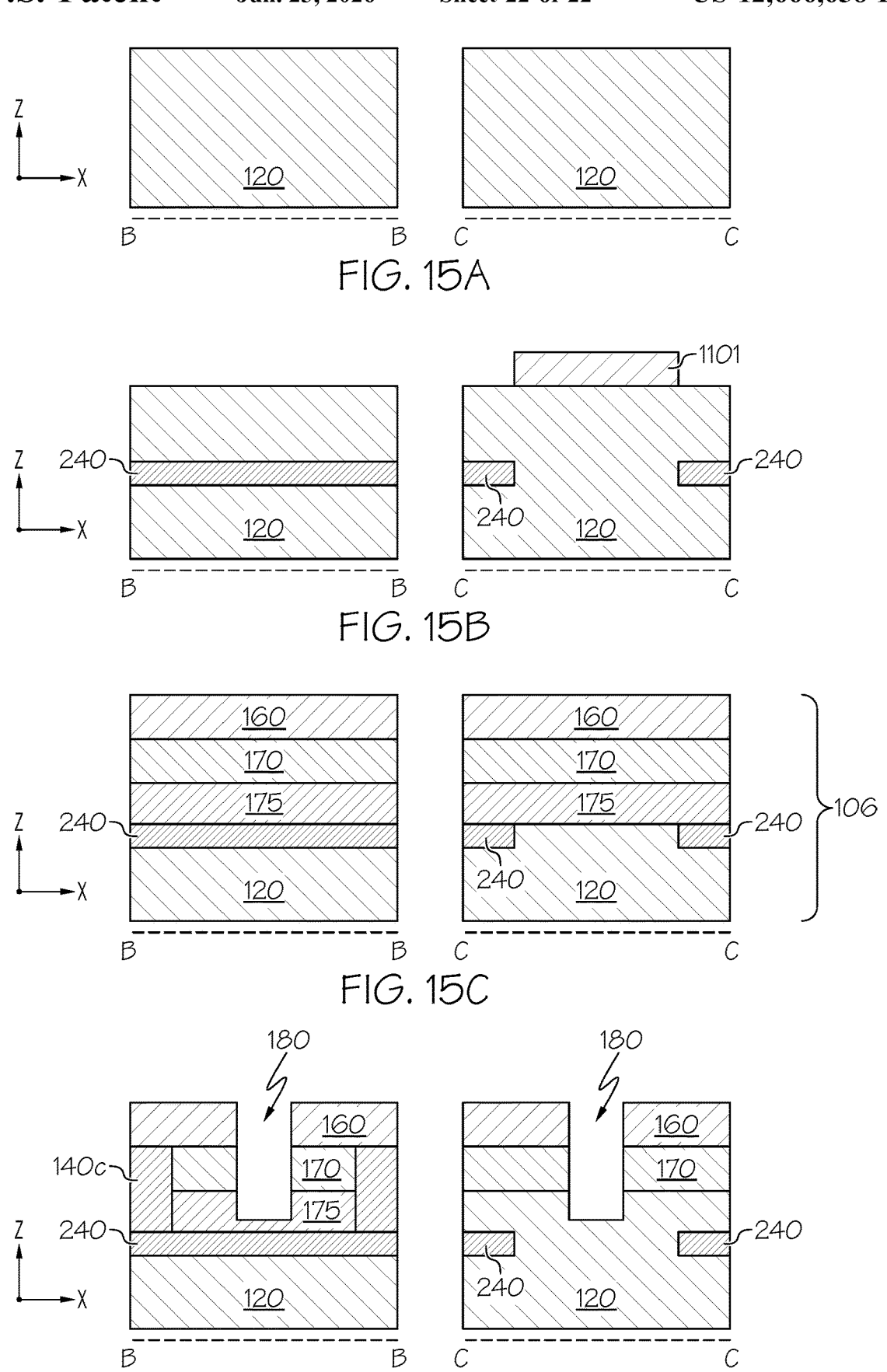
FIGS. 15A, 15B, 15C, and 15D are cross sectional views taken along lines B-B and C-C of the gate trench structure of FIG. 3A illustrating methods of fabricating power semiconductor devices including buried shielding structures according to some embodiments of the present disclosure.

As shown in FIG. 15A, a drift region 120 having a first (e.g., n–) conductivity type is formed (e.g., by an epitaxy process). In contrast to the embodiments discussed above, the drift region 120 may be formed to a desired thickness (e.g., the thickness of the semiconductor layer structure 106 in the completed device) prior to forming the buried shielding structure 240.

In FIG. 15B, the buried shielding structure 240 having a second (e.g., p–) conductivity type is formed in the drift region 120 at a desired depth (e.g., D1) relative to a surface S thereof. In particular, a mask pattern 1101 is formed on the surface S of the drift region 120, and the buried shielding structure 240 is formed in a desired pattern using one or more deep ion implantation processes to implant dopant material of the second conductivity type into the areas exposed by the mask pattern 1101. A dose and/or implantation energy of the implantation process(es) may be controlled to form the buried shielding structure 240 with predetermined dopant concentrations and/or depths (e.g., D1) below the surface S (e.g., with higher implantation energies resulting in greater depths).

In FIG. 15C, the mask pattern 1101 is removed, and a JFET region 175 of the first conductivity type, well region 170 of the second conductivity type, and source region 160 of the first conductivity type are formed in or on the second portion 120*b* of the drift region 120. In FIG. 15D, contact shielding structures 140*c* and gate trenches 180 are formed extending into a surface S of the semiconductor layer structure 106, as similarly described above with reference to FIGS. 11A-11E. Gate insulating layers 182*b*, gate electrodes 184*b*, source contacts 190, intermetal dielectric 186, and metal layer 196 may be subsequently formed to provide the device 200*b* of FIG. 2B.

Referring again to FIGS. 2A and 2B, after the operations shown in FIGS. 11E, 12F, 13E, 14D, and 15D, a drain contact 192 is provided on the substrate 110 opposite the drift region 120. As such, the buried shielding structure 240 laterally extends in the drift region 120 between the well region 170 and the drain contact 192. In some embodiments, the gate 184 may provide a first gate G1 of a first transistor TX1 in the semiconductor layer structure 106, and the buried shielding structure 240 may provide a second gate G2 of a second transistor TX2 in the semiconductor layer structure 106, such that the first and second transistors TX1, TX2 are electrically coupled in a cascode amplifier configuration 700.

It will be understood that any of the operations shown in FIGS. 11A to 15D may be combined in various embodiments herein. For example, one or more of pre-trench implant operations may be performed between one or more of the pre-trench heterojunction operations, or vice versa. Likewise, one or more of the post-trench implant operations may be performed between one or more of the post-trench heterojunction operations, or vice versa. More generally, the fabrication operations shown in FIGS. 11A to 15D are illustrated by way of example with reference to forming the shielding regions 140*a*, 140*c*, 240 by implantation or epitaxial growth or deposition, but it will be understood that any of the operations shown may be utilized in combination to provide any desired combination of implanted and heterojunction shielding regions 140*a*, 140*c*, 240, with similar or different depths and/or materials from one another.

The embodiments described herein thus illustrate various examples of different combinations of buried shielding structures in accordance with the present disclosure. However, it will be understood that embodiments of the present disclosure may include any and all combinations of the features described herein, and are not limited to the example patterns illustrated. Embodiments of the present invention may be used in trenched or planar gate vertical semiconductor power transistors, including but not limited to MOSFETs, IGBTs, or other power devices where a contact to a buried shielding region below and separated from the well or gate is desired.

In the description above, each example embodiment is described with reference to regions of particular conductivity types. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.).

The present invention has primarily been discussed above with respect to silicon carbide based power semiconductor devices. It will be appreciated, however, that silicon carbide is used herein as an example and that the devices discussed herein may be formed in any appropriate wide bandgap semiconductor material system. As an example, gallium nitride based semiconductor materials (e.g., gallium nitride, aluminum gallium nitride, etc.) may be used instead of silicon carbide in any of the embodiments described above. More generally, while discussed with reference to silicon carbide devices, embodiments of the present invention are not so limited, and may have applicability to devices formed using other wide bandgap semiconductor materials, for example, gallium nitride, zinc selenide, or any other II-VI or III-V wide bandgap compound semiconductor materials.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a fabrication operations. It will be appreciated that the steps shown in the fabrication operations need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A semiconductor device, comprising:
a semiconductor layer structure comprising a drift region of a first conductivity type and a well region of a second conductivity type above the drift region;
a gate on the semiconductor layer structure adjacent the well region;
at least one contact shielding structure of the second conductivity type vertically extending into the drift region and laterally spaced apart from the gate;
a bottom shielding structure of the second conductivity type under the gate; and
a buried shielding structure of the second conductivity type under the well region and separated therefrom by a portion of the drift region,
wherein the buried shielding structure laterally extends from the bottom shielding structure to the at least one contact shielding structure.

2. The semiconductor device of claim 1, wherein the semiconductor layer structure further comprises a gate trench having sidewalls and a bottom surface therebetween extending into the drift region, wherein the gate is in the gate trench, and
wherein the bottom shielding structure of the second conductivity type is under the bottom surface of the gate trench.

3. The semiconductor device of claim 1, wherein at least one of the buried shielding structure and the contact shielding structure comprises a material that is different from that of the drift region.

4. The semiconductor device of claim 3, wherein the drift region comprises a wide bandgap semiconductor material, and the at least one of the buried shielding structure and the contact shielding structure comprises polysilicon, nickel oxide, gallium nitride, or gallium oxide.

5. The semiconductor device of claim 1, wherein the buried shielding structure has a different concentration of dopants of the second conductivity type than the well region.

6. The semiconductor device of claim 1, wherein the semiconductor layer structure further comprises:
a substrate, wherein the drift region is on the substrate; and
a drain contact on the substrate opposite the drift region, wherein the buried shielding structure laterally extends in the drift region between the well region and the drain contact.

7. The semiconductor device of claim 6, wherein the semiconductor layer structure further comprises:
a current spreading region of the first conductivity type extending between the well region and the drain contact, wherein the current spreading region comprises a greater dopant concentration than the drift region.

8. The semiconductor device of claim 6, wherein the buried shielding structure comprises a pattern including one or more segments that extend in a first lateral direction, and the gate extends in a second lateral direction that is different from the first lateral direction.

9. The semiconductor device of claim 8, wherein a respective width of the one or more segments along the second lateral direction is between about 0.1 and 20 microns.

10. The semiconductor device of claim 8, wherein the one or more segments of the buried shielding structure and/or the gate provide linear, elliptical, or polygonal shapes in plan view.

11. The semiconductor device of claim 6, wherein the gate comprises a first gate of a first transistor in the semiconductor layer structure, and the buried shielding structure comprises a second gate of a second transistor in the semiconductor layer structure.

12. The semiconductor device of claim 11, wherein the first and second transistors are electrically coupled in a cascode amplifier configuration.

13. The semiconductor device of claim 12, wherein the semiconductor layer structure further comprises a source region of the first conductivity type above the well region, and further comprising:
a source contact on a surface of the semiconductor layer structure opposite the drain contact, wherein the source contact is electrically coupled to the source region and the buried shielding structure.

14. A semiconductor device, comprising:
a semiconductor layer structure comprising a drift region of a first conductivity type and a well region of a second conductivity type above the drift region;
a gate on the semiconductor layer structure adjacent the well region;
a buried shielding structure of the second conductivity type under the well region and separated therefrom by a portion of the drift region; and
a drain contact on the semiconductor layer structure below the drift region,
wherein the buried shielding structure comprises segments that extend in a first lateral direction and the gate extends in a second lateral direction that is different from the first lateral direction,
wherein the segments are laterally spaced apart such that at least a part of an electrical conduction path between the well region and the drain contact laterally extends along the buried shielding structure in the second lateral direction.

15. A semiconductor device, comprising:
a semiconductor layer structure comprising:
a drift region of a first conductivity type;
a buried shielding structure of a second conductivity type in the drift region;
a well region of the second conductivity type above the drift region; and
a source region of the first conductivity type above the well region; and a source contact on a surface of the semiconductor layer structure, wherein the source contact is electrically coupled to the source region and to the buried shielding structure, wherein the source region, the well region, and a first portion of the drift region between the well region and the buried shielding structure provide p-n junctions of a first transistor, and wherein the first portion of the drift region, the buried shielding structure, and a second portion of the drift region provide p-n junctions of a second transistor.

16. The semiconductor device of claim 15, wherein the source contact is electrically coupled to the buried shielding structure by at least one contact shielding structure of the second conductivity type.

17. The semiconductor device of claim 16, further comprising:

a gate on the semiconductor layer structure adjacent the well region, wherein the gate comprises a first gate of the first transistor, and the buried shielding structure comprises a second gate of the second transistor.

18. The semiconductor device of claim 17, wherein the first and second transistors are electrically coupled in a cascode amplifier configuration.

19. The semiconductor device of claim 17, wherein the semiconductor layer structure further comprises:

a gate trench having sidewalls and a bottom surface therebetween extending into the drift region, wherein the gate is in the gate trench, and wherein a metal layer extends from the source contact along at least one of the sidewalls of the gate trench to contact the buried shielding structure.

20. A semiconductor device, comprising:

a semiconductor layer structure comprising a first surface and a second surface opposite the first surface;

a gate adjacent the first surface of the semiconductor layer structure;

a drain contact on the second surface of the semiconductor layer structure;

a source contact on the first surface of the semiconductor layer structure, wherein the source contact is electrically coupled to a source region of a first conductivity type and a buried shielding structure of a second conductivity type in the semiconductor layer structure; and first and second transistors in the semiconductor layer structure and electrically coupled in a cascode amplifier configuration between the first and second surfaces thereof.

21. The semiconductor device of claim 20, wherein the source contact is electrically coupled to the buried shielding structure by at least one contact shielding structure of the second conductivity type.

22. The semiconductor device of claim 21, wherein the semiconductor layer structure comprises:

a drift region of the first conductivity type;

a well region of the second conductivity type above the drift region; and the source region of the first conductivity type above the well region, wherein the source region, the well region, and a first portion of the drift region between the well region and the buried shielding structure provide the first transistor, and wherein the first portion of the drift region, the buried shielding structure, and a second portion of the drift region provide the second transistor.

23. The semiconductor device of claim 22, wherein the semiconductor layer structure further comprises:

a gate trench having sidewalls and a bottom surface therebetween extending into the drift region, wherein the gate is in the gate trench, and wherein a metal layer extends from the source contact along at least one of the sidewalls of the gate trench to contact the buried shielding structure.

24. A method of fabricating a semiconductor device, the method comprising:

providing a drift region of a first conductivity type;

providing a buried shielding structure of a second conductivity type in the drift region;

providing a well region of the second conductivity type above the drift region and separated from the buried shielding structure, wherein the drift region, the buried shielding structure, and the well region form a semiconductor layer structure;

providing a bottom shielding structure of the second conductivity type;

providing at least one contact shielding structure of the second conductivity type vertically extending into the drift region; and providing a gate on the semiconductor layer structure adjacent the well region, wherein the bottom shielding structure is under the gate, the at least one contact shielding structure is laterally spaced apart from the gate, and the buried shielding structure laterally extends from the bottom shielding structure to the at least one contact shielding structure.

25. The method of claim 24, wherein the buried shielding structure comprises a pattern including one or more segments that laterally extend in the drift region.

26. The method of claim 25, wherein providing the buried shielding structure comprises:

forming a first portion of the drift region by a first epitaxy process;

forming the buried shielding structure in or on the first portion of the drift region; and forming a second portion of the drift region on the buried shielding structure by a second epitaxy process.

27. The method of claim 26, wherein forming the buried shielding structure comprises:

implanting dopants of the second conductivity type into or depositing a material of the second conductivity type on the first portion of the drift region to form the buried shielding structure.

28. The method of claim 27, further comprising:

forming a mask pattern on the first portion of the drift region before the implanting or the depositing, wherein the implanting or the depositing is performed in or on areas of the drift region exposed by the mask pattern to form the pattern of the buried shielding structure.

29. The method of claim 27, wherein the implanting or the depositing is performed as a blanket process without a mask pattern, and further comprising:

forming a mask pattern on the first portion of the drift region after the implanting or the depositing; and performing an etching process on areas of the first portion of the drift region exposed by the mask pattern to form the pattern of the buried shielding structure.

30. The method of claim 26, further comprising:

forming a current spreading region comprising a greater concentration of dopants of the first conductivity type in the first portion of the drift region, wherein the buried shielding structure extends adjacent the current spreading region.

31. The method of claim 25, wherein providing the buried shielding structure comprises:

forming a mask pattern on a surface of the drift region; and implanting dopants of the second conductivity type into areas of the drift region exposed by the mask pattern with an implantation energy corresponding to a predetermined depth below the surface of the drift region to form the pattern of the buried shielding structure.

32. The method of claim 25, wherein the semiconductor layer structure comprises a substrate, wherein the drift region is on the substrate, and further comprising:

providing a drain contact on the substrate opposite the drift region, wherein the buried shielding structure laterally extends in the drift region between the well region and the drain contact.

33. The method of claim 32, wherein the gate comprises a first gate of a first transistor in the semiconductor layer structure, and the buried shielding structure comprises a second gate of a second transistor in the semiconductor layer structure.

34. The method of claim 33, wherein the first and second transistors are electrically coupled in a cascode amplifier configuration.

35. The method of claim 34, further comprising:

providing a source region of the first conductivity type above the well region; and providing a source contact on a surface of the semiconductor layer structure opposite the drain contact, wherein the source contact is electrically coupled to the source region and the buried shielding structure.

36. The method of claim 35, wherein providing the gate comprises:

forming a gate trench having sidewalls and a bottom surface therebetween extending into a surface of the semiconductor layer structure through the source region and the well region to a depth of about 0.3 to about 10 microns relative to the surface; and forming the gate in the gate trench.

37. The method of claim 36, wherein the method further comprises:

forming a metal layer extending from the source contact along at least one of the sidewalls of the gate trench to contact the buried shielding structure.

38. The method of claim 25, wherein the one or more segments extend in a first lateral direction, the gate extends in a second lateral direction that is different from the first lateral direction, and a respective width of the one or more segments along the second lateral direction is between about 0.1 and 20 microns.

39. The method of claim 25, wherein the one or more segments of the buried shielding structure and/or the gate provide linear, elliptical, or polygonal shapes in plan view.

40. The method of claim 24, wherein the buried shielding structure has a different concentration of dopants of the second conductivity type than the well region.

41. The method of claim 24, wherein the buried shielding structure comprises a material that is different from that of the drift region.

* * * * *